(12) United States Patent
Kondo et al.

(10) Patent No.: US 8,958,241 B2
(45) Date of Patent: Feb. 17, 2015

(54) MAGNETIC MEMORY

(71) Applicant: Kabushiki Kaisha Toshiba, Minato-ku (JP)

(72) Inventors: Tsuyoshi Kondo, Kawasaki (JP);
Hirofumi Morise, Yokohama (JP);
Shiho Nakamura, Fujisawa (JP);
Takuya Shimada, Yokohama (JP);
Yoshiaki Fukuzumi, Yokohama (JP);
Hideaki Aochi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/021,096

(22) Filed: Sep. 9, 2013

(65) Prior Publication Data
US 2014/0104941 A1    Apr. 17, 2014

(30) Foreign Application Priority Data
Oct. 11, 2012    (JP) .................................. 2012-225910

(51) Int. Cl.
*G11C 11/14*    (2006.01)
*G11C 11/02*    (2006.01)
*B82Y 10/00*    (2011.01)

(52) U.S. Cl.
CPC ............. *G11C 11/02* (2013.01); *Y10S 977/762* (2013.01); *Y10S 977/838* (2013.01); *Y10S 977/943* (2013.01); *B82Y 10/00* (2013.01)
USPC ........... 365/171; 365/158; 257/369; 257/295; 977/762; 977/838; 977/943

(58) Field of Classification Search
USPC ..................... 365/171, 158, 189.08
See application file for complete search history.

(56) References Cited

U.S. PATENT DOCUMENTS

| | | | |
|---|---|---|---|
| 8,149,485 B2 * | 4/2012 | Li et al. .............................. | 359/9 |
| 2008/0278998 A1 * | 11/2008 | Cowburn et al. .............. | 365/171 |
| 2013/0077395 A1 | 3/2013 | Kondo et al. | |

FOREIGN PATENT DOCUMENTS

JP    2008-160079    7/2008

* cited by examiner

*Primary Examiner* — Hoai V Ho
*Assistant Examiner* — Muhammad Islam
(74) *Attorney, Agent, or Firm* — Oblon, Spivak, McClelland, Maier & Neustadt, L.L.P.

(57) ABSTRACT

A magnetic memory according to an embodiment includes: a magnetic nanowire; first insulating layers provided on a first surface of the magnetic nanowire, each of the first insulating layers having a first and second end faces, a thickness of the first insulating layer over the first end face being thicker than a thickness of the first insulating layer over the second end face; first electrodes on surfaces of the first insulating layers opposite to the first surface; second insulating layers on the second surface of the magnetic nanowire, each of the second insulating layers having a third and fourth end faces, a thickness of the second insulating layer over the third surface being thicker than a thickness of the second insulating layer over the fourth end face; and second electrodes on surfaces of the second insulating layers.

18 Claims, 36 Drawing Sheets

MAGNETIC MEMORY

CROSS REFERENCE TO RELATED APPLICATIONS

This application is based upon and claims the benefit of priority from the prior Japanese Patent Application No. 2012-225910, filed on Oct. 11, 2012, the entire contents of which are incorporated herein by reference.

FIELD

Embodiments described herein relate generally to a magnetic memory.

BACKGROUND

A magnetic memory that records information using a magnetic domain structure in a magnetic nanowire has been proposed. Recently, it has been demonstrated by experiments that the position of a magnetic domain wall can be changed by a current. As a result, it is expected that a magnetic memory that uses a magnetic nanowire be made. A magnetic domain wall means a boundary between adjacent magnetic domains having different magnetization directions.

However, as information in magnetic nanowires (that is expressed by magnetic domain walls or magnetic domains) is implemented more densely, the power consumption due to the drive current of the magnetic domain walls thereby increases. For example, if information should be stored in an LSI at a high density, it is inevitable that an improvement in the speed of inputting and outputting information be required. When the improvement in the speed of inputting and outputting information should be realized by a parallel operation of magnetic nanowires, the power consumption increases as the number of magnetic nanowires that operate in parallel increases.

DETAILED DESCRIPTION

Figure 1:
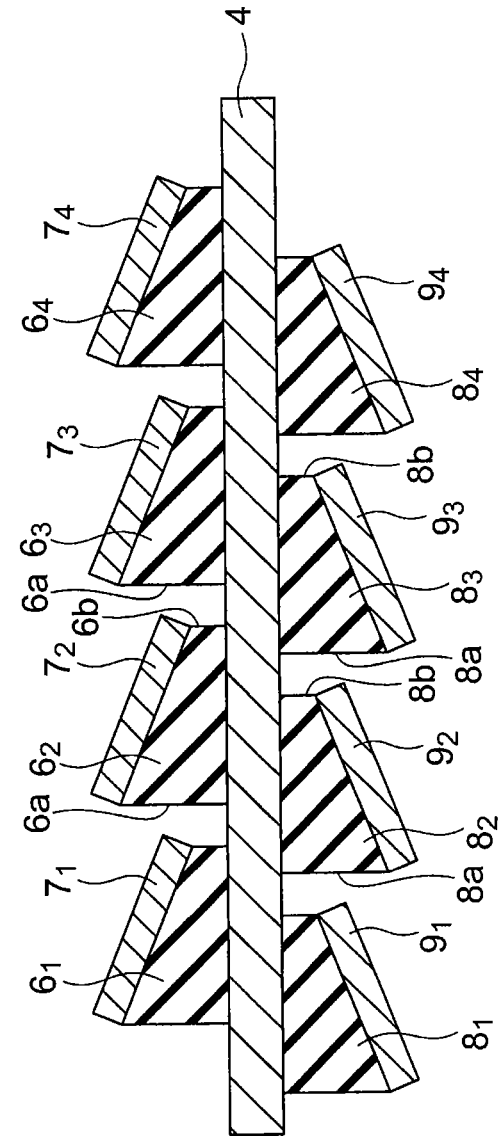
FIG. 1 is a cross-sectional view schematically showing the structure of a magnetic memory according to a first embodiment.
Figure 1:
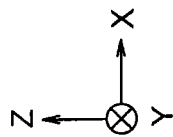

A magnetic memory according to an embodiment includes: a magnetic nanowire including a first surface and a second surface being opposite to the first surface; a plurality of first insulating layers provided onto the first surface of the magnetic nanowire along a first direction in which the magnetic nanowire extends, each of the first insulating layers having a first end face that intersects the first direction, and a second end face being opposite to the first end face and arranged to be spaced apart from the first end face along the first direction, a thickness of the first insulating layer over the first end face in a direction perpendicular to the first surface being thicker than a thickness of the first insulating layer over the second end face; a plurality of the first electrodes provided onto the surfaces of the first insulating layers opposite to the first surface; a plurality of the second insulating layers provided onto the second surface of the magnetic nanowire along the first direction, each of the second insulating layers having a third end face that intersects the first direction and a fourth end face being opposed to the third end face and arranged to be spaced apart from the third end face along the first direction, a thickness of the second insulating layer over the third surface in the direction perpendicular to the second surface being thicker than a thickness of the second insulating layer over the fourth end face; and a plurality of the second electrodes provided onto the surface of the second insulating layers opposite to the second surface.

Hereinafter, embodiments will be described with reference to the accompanying drawings. The same reference numerals represent the same elements. It should be noted that the drawings are schematic or conceptional, and that therefore the relationship between the thickness and the width of each element, the ratio between the lengths of elements, etc. do not match those of actual elements. Furthermore, there is a case where the same element shown in different drawings may have different dimensions or ratios.

First Embodiment

FIG. 1 shows a magnetic memory described in the first embodiment. FIG. 1 is a cross-sectional view of a magnetic memory 1 of the first embodiment. The magnetic memory 1 of this embodiment includes a magnetic nanowire 4 having a first surface and a second surface being opposite to the first surface, a plurality of insulating layers $6_i$ (i=1, ..., 4) provided onto the first surface of the magnetic nanowire 4 and spaced by a interval in a direction in which the magnetic nanowire 4 extends, electrodes $7_i$ (i=1, ..., 4) each provided onto one of the insulating layers $6_i$ (i=1, ..., 4), a plurality of insulating layers $8_j$ (j=1, ..., 4) provided onto the second surface of the magnetic nanowire 4 and spaced with a interval in the direction in which the magnetic nanowire 4 extends, and electrode $9_j$ (j=1, ..., 4) each provided onto one of the insulating layers $8_j$ (j=1, ..., 4). If we assume that the first surface is an upper surface and the second surface is a lower surface of the magnetic nanowire 4, the lower surface of each insulating layer $6_i$ (i=1, ..., 4) contacts with the first surface of the magnetic nanowire 4, and the upper surface of each insulating layer $8_j$ (j=1, ..., 4) contacts with the second surface of the magnetic nanowire 4.

If we assume that the direction along which the magnetic nanowire 4 extends is the X-axis direction, the first surface and the second surface are parallel to the X-Y plane determined by the X axis and the Y axis. Incidentally, the Z axis represents the thickness direction of the magnetic nanowire 4. Thus, FIG. 1 shows a cross-sectional view taken along the X-Z plane.

An insulating layer $8_i$ is provided to each insulating layer $6_i$ (i=1, ..., 4). An insulating layer $6_i$ (i=1, ..., 4) and an insulating layer $8_i$ corresponding to each other are arranged to overlap each other in the direction in which the magnetic nanowire 4 extends (in the X-axis direction). Specifically, if we assume that the two end faces in the X-axis direction of an insulating layer $6_i$ (i=1, ..., 4) are 6a and 6b, and the two end faces in the X-axis direction of the corresponding insulating layer $8_i$ are 8a and 8b, the end face 6a of the insulating layer $6_i$ is positioned between the end face 8a and the end face 8b of the corresponding insulating layer $8_i$, the end face 8b of the insulating layer $8_i$ is positioned between the end face 6a and the end face 6b of the corresponding insulating layer $6_i$, and the end face 6b of the insulating layer $6_i$ is positioned between the end faces 8a and 8b of the insulating layer $8_{i+1}$ being adjacent to the corresponding insulating layer $8_i$ in the positive direction on the X axis. The end face 6a is positioned in the negative X-direction of the end face 6b, and the end face 8a is positioned in the negative X-direction of the end face 8b.

Unlike the case shown in FIG. 1, the end face 8a of the insulating layer $8_i$ (i=1, ..., 4) can be positioned between the end face 6a and the end face 6b of the corresponding insulating layer $6_i$, the end face 6b of the insulating layer $6_i$ can be positioned between the end face 8a and the end face 8b of the corresponding insulating layer $8_i$, and the end face 8b of the insulating layer $8_i$ can be positioned between the end face 6a and the end face 6b of the insulating layer $6_{i+1}$ that is adjacent to the corresponding insulating layer $6_i$ in the positive direction on the X axis.

In the first embodiment, the thickness of the insulating layer $6_i$ (i=1, ..., 4) at the end face 6a is thicker than that at the end face 6b, i.e., the height of the end face 6a from the magnetic nanowire 4 in the direction perpendicular to the first surface of the magnetic nanowire 4 (in the Z-axis direction) is greater than the height of the end face 6b from the magnetic nanowire 4 in the Z-axis direction. In other words, the thickness of the insulating layer $6_i$ (i=1, ..., 4) decreases from the end face 6a to the end face 6b monotonically. In FIG. 1, the thickness of the insulating layer $6_i$ (i=1, ..., 4) decreases linearly from the end face 6a to the end face 6b. Thus, the upper surface of the insulating layer $6_i$ (i=1, ..., 4) is a flat surface, which inclines to the first surface of the magnetic nanowire 4. The thickness of the insulating layer $6_i$ (i=1, ..., 4) does not need to decrease linearly from the end face 6a to the end face 6b as long as it decreases monotonically. Such a monotonic decrease in thickness enables the shift of magnetic domain wall, which will be described later. The thickness of the insulating layer $6_i$ (i=1, ..., 4) is in a range of approximately 0.5 nm to 10 nm.

The thickness of the insulating layer $8_i$ (i=1, ..., 4) at the end face 8a is thicker than that at the end face 8b, i.e., the height of the end face 8a from the magnetic nanowire 4 in the direction perpendicular to the first surface of the magnetic nanowire 4 (in the Z-axis direction) is greater than the height of the end face 8b from the magnetic nanowire 4 in the Z-axis direction. The thickness of the insulating layer $8_i$ (i=1, ..., 4) decreases from the end face 8a to the end face 8b monotonically. In FIG. 1, the thickness of the insulating layer $8_i$ (i=1, ..., 4) decreases linearly from the end face 8a to the end face 8b. Thus, the lower surface of the insulating layer $8_i$ (i=1, ..., 4) is a flat surface, which inclines to the second surface of the magnetic nanowire 4. The thickness of the insulating layer $8_i$ (i=1, ..., 4) does not need to decrease linearly from the end face 8a to the end face 8b, as long as it decreases monotonically so as to enable the shift of magnetic domain wall. The thickness of the insulating layer $8_i$ (i=1, ..., 4) is in a range of approximately 0.5 nm to 10 nm.

The distance between the end face 6a and the end face 6b of the insulating layer $6_i$ (i=1, ..., 4) is not necessarily the same as the distance between the end face 8a and the end face 8b of the insulating layer $8_i$ (i=1, ..., 4).

In the first embodiment shown in FIG. 1, both the insulating layer $6_i$ (i=1, ..., 4) and the insulating layer $8_i$ (i=1, ..., 4) are arranged to be spaced from adjacent ones in the X-axis direction. However, the spaces can be eliminated for either or both of the insulating layer $6_i$ (i=1, ..., 4) and the insulating layer $8_i$ (i=1, ..., 4). For the insulating layer $6_i$ (i=1, ..., 4) and the insulating layer $6_{i+1}$ adjacent to each other, the end face 6b of the insulating layer $6_i$ can be positioned at the same location as the end face 6a of the insulating layer $6_{i+1}$. Similarly, for the insulating layer $8_i$ (i=1, ..., 4) and the insulating layer $8_{i+1}$ being adjacent to each other, the end face 8b of the insulating layer $8_i$ can be positioned at the same location as the end face 8a of the insulating layer $8_{i+1}$. In such a case, the electrode $7_i$ (i=1, ..., 4) and the electrode $9_j$ (j=1, ..., 4) can be connected to adjacent ones.

The electrode $7_i$ (i=1, ..., 4) is provided onto the upper surface of the insulating layer $6_i$ (i=1, ..., 4), and the electrode $9_i$ (i=1, ..., 4) is provided onto the lower surface of the insulating layer $8_i$ (i=1, ..., 4).

The magnetic nanowire 4 is formed of a conductive material. The magnetic nanowire 4 is formed of a ferromagnetic material, ferrimagnetic material, or artificial lattice. As the ferromagnetic material to form the magnetic nanowire 4, an alloy containing at least one element selected from the group consisting of iron (Fe), cobalt (Co), nickel (Ni), manganese (Mn), and chromium (Cr), and at least one element selected from the group consisting of platinum (Pt), palladium (Pd), iridium (Ir), ruthenium (Ru), and rhodium (Rh) can be used. For example, CoPt, NiFe, and CoCrPt can also be used as the ferromagnetic material. The property of the ferromagnetic material can be changed by changing the composition, performing a heat treatment, etc.

As the ferrimagnetic material to form the magnetic nanowire 4, an amorphous alloy containing a rare-earth element such as TbFeCo and GdFeCo, and a transition metal can be used. These materials have a characteristic that the magnetization thereof tends to point toward the stacking direction (the Z-axis direction) when these materials are deposited by a sputtering device under selected conditions. Thus, these materials can be used when the magnetization direction of the magnetic nanowire 4 should be oriented in the Z-axis direction.

As the artificial lattice to form the magnetic nanowire 4, a material having a stacked structure containing Co/Pt, Co/Pd, or Co/Ni can be used. By using a stacked structure containing the aforementioned materials, it is possible to orient the magnetization direction of the magnetic nanowire 4 toward the Z-axis direction. It is likely that such a stacked structure has the <0001> orientation of a hexagonal close-packed structure or the <111> orientation of a face-centered cubic structure.

For example, the insulating layer $6_i$ (i=1, ..., 4) and the insulating layer $8_i$ (j=1, ..., 4) are formed of an oxide, nitride, fluoride, or oxynitride containing at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe). Specifically, magnesium oxide (MgO) can be used to form the insulating layers $6_i$ and $8_i$ (i=1, ..., 4).

The electrode $7_i$ (i=1, ..., 4) and the electrode $9_j$ (j=1, ..., 4) are formed of a conductive material. As the conductive material, for example, at least one element selected from the group consisting of copper (Cu), gold (Au), silver (Ag), and aluminum (Al) can be used. An alloy containing a combination of these elements can also be used.

(Operating Principle)

The operating principle of the magnetic memory 1 according to the first embodiment is described below.

(Write Operation)

First, the write operation of the magnetic memory 1 according to the first embodiment is described.

Figure 2:
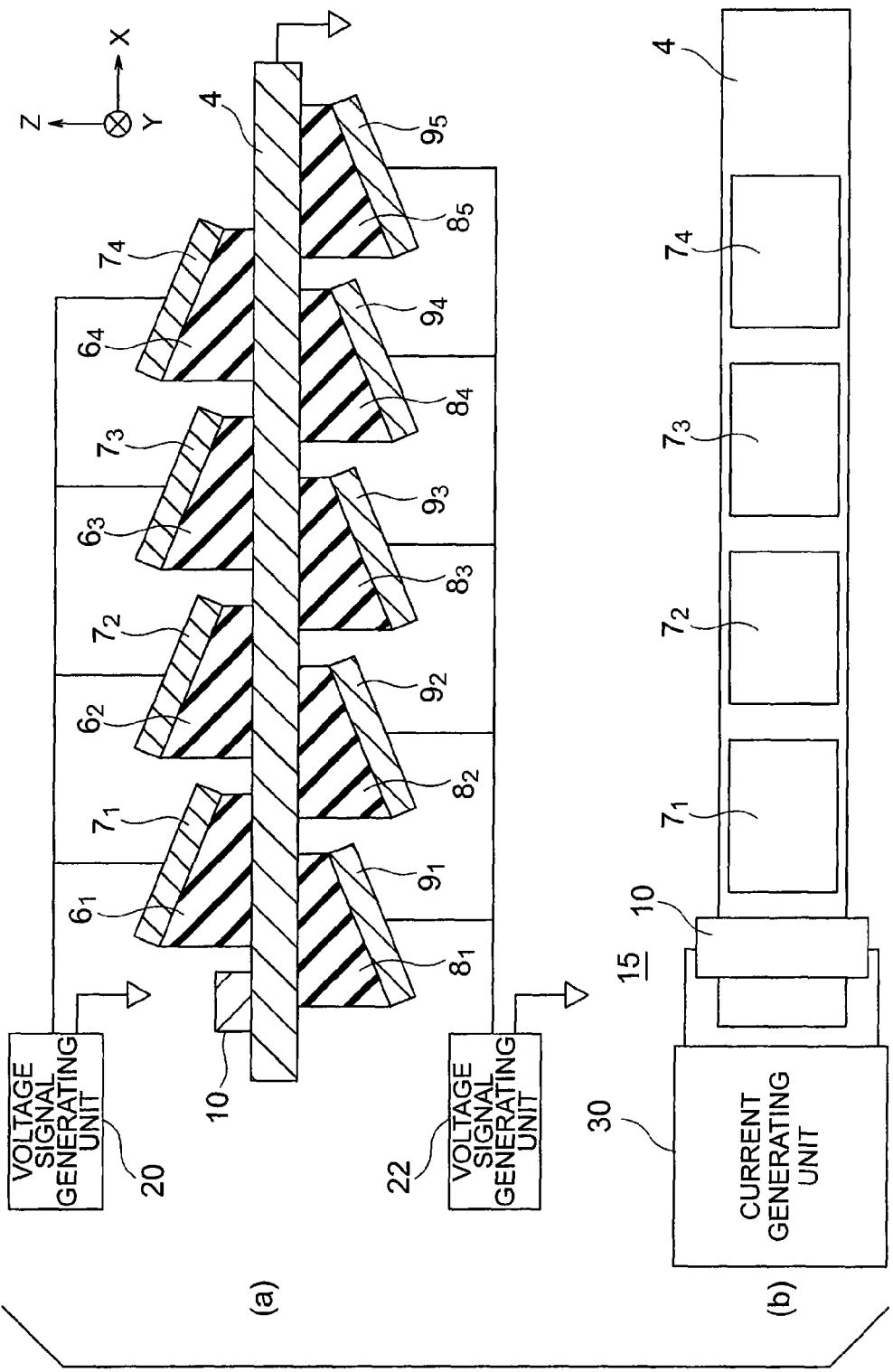
FIGS. 2(a) and 2(b) are drawings showing a device for writing information to the magnetic memory according to the first embodiment.

FIGS. 2(a) and 2(b) show a device for writing information to the magnetic memory 1 according to the first embodiment. FIG. 2(a) is a cross-sectional view of the magnetic memory 1 being parallel to the X-Z plane, and FIG. 2(b) is a top view of the magnetic memory 1 viewed from the Z direction. The magnetic memory 1 of the first embodiment also includes a reading unit, but this is going to be described later.

The magnetic memory 1 also includes a voltage signal generating unit 20 connected to the electrodes $7_i$ (i=1, ..., 4), a voltage signal generating unit 22 connected to the electrodes $9_j$ (j=1, ..., 5), an electrode 10 provided to the magnetic nanowire in the Z-axis direction, and a current generating unit 30 connected to the electrode 10. Here, generating unit also refers to a generator.

The voltage signal generating unit 20 applies a voltage between the electrodes $7_i$ (i=1, ..., 4) and the magnetic nanowire 4. The voltage signal generating unit 22 applies a voltage between the electrodes $9_j$ (j=1, ..., 5) and the magnetic nanowire 4. The voltage signal generating units 20, 22 are magnetic domain wall shifting devices for shifting the magnetic domain walls of the magnetic nanowire 4.

The magnetization in a part of the magnetic nanowire 4 is switched by applying a magnetic field, generated by causing a current to flow through the electrode 10 using the current generating unit 30, to the magnetic nanowire 4. A magnetic domain wall is formed in the magnetic nanowire 4 when the magnetization of a part of the magnetic nanowire 4 is switched. A magnetic domain means a region in which the magnetization direction is the same. At the boundary between two adjacent magnetic domains, the magnetization direction continuously changes in the extending direction of the nanowire. Such a region is called "magnetic domain wall". The electrode 10 and the current generating unit 30 form a writing unit 15. In this case, the write operation is performed on the magnetic nanowire 4 by a magnetic field (current-induced magnetic field) generated by a current flowing through the electrode 10.

Figure 3:
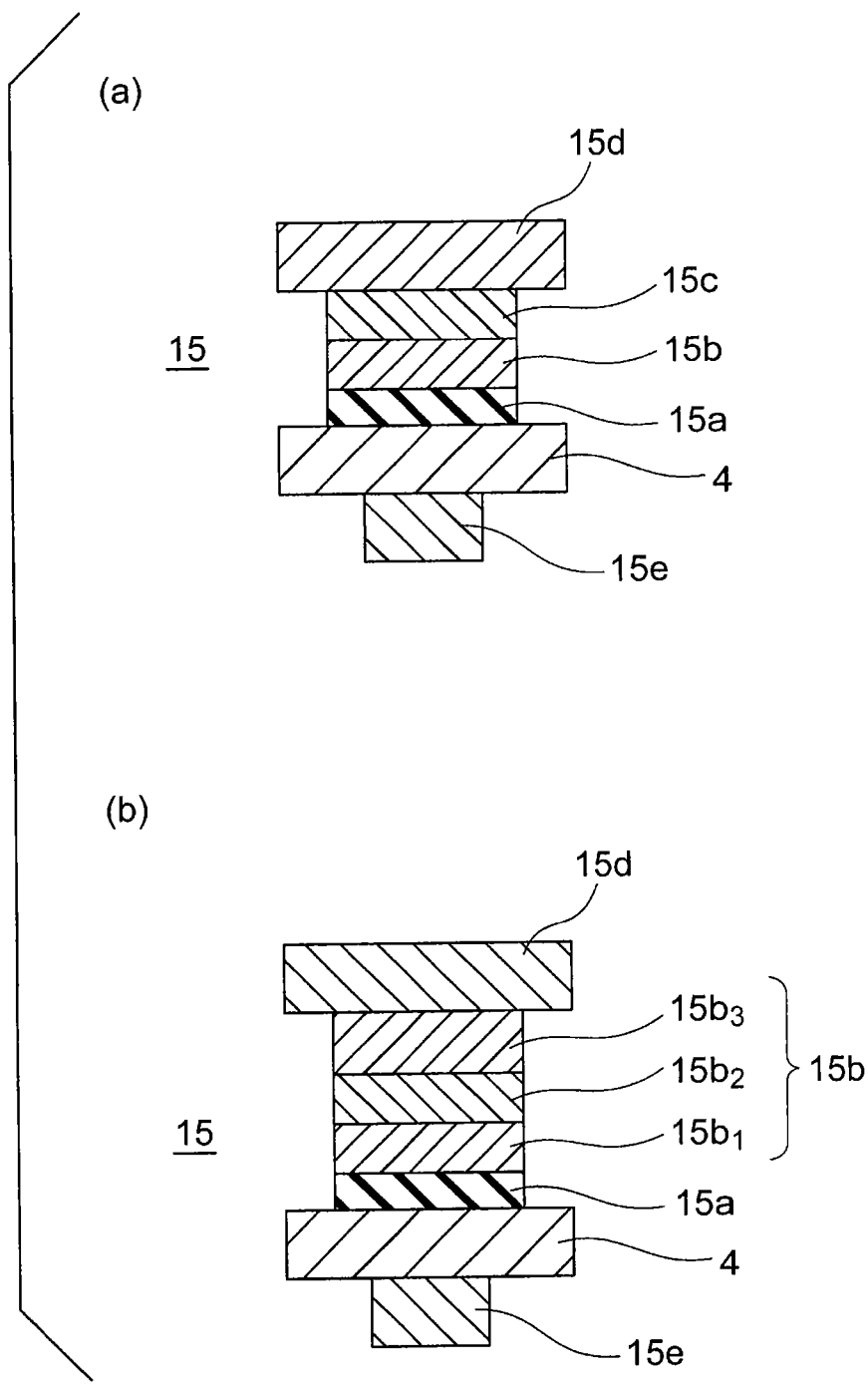
FIGS. 3(a) and 3(b) are cross-sectional views showing examples of writing unit.

Besides the current-induced magnetic field method, a spin transfer torque switching method as shown in FIGS. 3(a) and 3(b) can be used for the writing unit 15.

The writing unit 15 shown in FIG. 3(a) includes a spacer layer 15a provided onto one of the first surface and the second surface of the magnetic nanowire 4, a reference layer 15b consisting of a magnetic material provided onto the spacer layer 15a, an antiferromagnetic layer 15c provided onto the reference layer 15b which fixes the magnetization direction of the reference layer 15b, an electrode 15d provided onto the antiferromagnetic layer 15c, and an electrode 15e provided onto one of the first surface and the second surface of the magnetic nanowire so as to face the spacer layer 15a. A nonmagnetic layer can be provided between the magnetic nanowire 4 and the electrode 15e.

The writing unit shown in FIG. 3(b) includes a spacer layer 15a provided onto one of the first surface and the second surface of the magnetic nanowire 4, a magnetic layer $15b_1$ provided onto the spacer layer 15a in which the magnetization direction is fixed, an intermediate layer $15b_2$ provided onto the magnetic layer $15b_1$, a magnetic layer $15b_3$ provided onto the intermediate layer $15b_2$ in which the magnetization direction is fixed, an electrode 15d provided onto the magnetic layer $15b_3$, and an electrode 15e provided onto one of the first surface and the second surface of the magnetic nanowire so as to face the spacer layer 15a. The magnetic layer $15b_1$ and the magnetic layer $15b_3$ can be coupled with each other via the intermediate layer $15b_2$ by antiferromagnetic coupling or ferromagnetic coupling. The stacked structure including the magnetic layer $15b_1$, the intermediate layer $15b_2$, and the magnetic layer $15b_3$ works as the reference layer 15b. If the stray magnetic field to the magnetic nanowire 4 is considered, the antiferromagnetic coupling is preferable. A nonmagnetic layer can be provided between the magnetic nanowire 4 and the electrode 15e.

An insulating layer for tunnelling barrier or nonmagnetic metals can be used to form the spacer layer 15a. As insulating layer for tunneling barrier the insulating layer for tunneling barrier, for example, an oxide, nitride, fluoride, or oxynitride containing at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) can be used. Besides the above materials, semiconductor materials with a large energy gap such as AlAs, GaN, AlN, ZnSe, ZnO, and MgO can also be used. As nonmagnetic metals, for example, copper (Cu), gold (Au), silver (Ag), or aluminum (Al) can be used. An alloy containing a combination of these elements can also be used.

The same materials as for forming the electrode $7_i$ (i=1, ..., 4) can be used to form the electrode 10, the electrode 15d, and the electrode 15e.

A method of writing magnetization information to a part of the magnetic nanowire 4 using the writing unit 15 shown in FIG. 3(a) is going to be described below. The write operation is performed by causing a current to flow from the electrode 15d toward the electrode 15e, or vice versa. For example, if the write operation is performed so that the magnetization direction of a part of the magnetic nanowire 4 becomes parallel (in the same direction) to the magnetization direction of the reference layer 15b, an electron current (that flows in a direction opposite to the direction of current) is caused to flow from the electrode 15d to the electrode 15e via the antiferromagnetic layer 15c, the reference layer 15b, the intermediate layer 15a, and the part of the magnetic nanowire 4. In this case, electrons are spin-polarized when passing through the reference layer 15b, and thus the spin-polarized electrons flow into the part of the magnetic nanowire 4 via the intermediate layer 15a. The spin-polarized electrons flowing into the part of the magnetic nanowire 4 convey the spin torque to the part of the magnetic nanowire 4, resulting in that the magnetization of the part of the magnetic nanowire 4 becomes parallel to the magnetization direction of the reference layer 15b. As a result, the magnetization of the part of the magnetic nanowire 4 becomes parallel to the magnetization direction of the reference layer 15b.

If the write operation is performed so that the magnetization direction of a part of the magnetic nanowire 4 becomes antiparallel (opposite direction) to the magnetization direction of the reference layer 15b, an electron current (that flows in a direction opposite to the direction of current) is caused to flow from the electrode 15e to the electrode 15d via the part of the magnetic nanowire 4, the intermediate layer 12a, the reference layer 15b, and the antiferromagnetic layer 15c. In this case, electrons are spin-polarized when passing through the part of the magnetic nanowire 4, and the spin-polarized electrons flow into the reference layer 15b via the intermediate layer 15a. Among the spin-polarized electrons, the electrons having a spin parallel to the magnetization direction of the reference layer 15b pass through the reference layer 15b. However, the electrons having a spin antiparallel to the magnetization direction of the reference layer 15b are reflected at the interface between the intermediate layer 15a and the reference layer 15b, and flow into the part of the magnetic nanowire 4 via the intermediate layer 15a. The spin-polarized electrons flowing into the part of the magnetic nanowire 4 convey the spin torque to the part of the magnetic nanowire 4, resulting in that the magnetization of the part of the magnetic nanowire 4 becomes antiparallel to the magnetization direction of the reference layer 15b. As a result, the magnetization of the part of the magnetic nanowire 4 becomes antiparallel to the magnetization direction of the reference layer 15b.

In the writing unit 15 shown in FIG. 3(b), the write operation is performed in a similar manner. For example, if the write operation is performed so that the magnetization direction of the part of the magnetic nanowire 4 becomes parallel to the magnetization direction of the magnetic layer $15b_1$, an electron current is caused to flow from the electrode 15d to the electrode 15e via the reference layer 15b, the spacer layer 15a, and the part of the magnetic nanowire 4. If the write operation is performed so that the magnetization direction of the part of the magnetic nanowire 4 becomes antiparallel to the magnetization direction of the magnetic layer $15b_1$, an electron current is caused to flow from the electrode 15e to the electrode 15d via the part of the magnetic nanowire 4, the intermediate layer 12a, and the reference layer 15b.

(Shift of Magnetic Domain Wall in Magnetic Nanowire)

The shift of the magnetic domain walls in the magnetic nanowire 4 is going to be described below.

FIGS. 4(a), 4(b), and 4(c) are drawings for explaining the dependence of the magnetic energy of the magnetic nanowire 4 on the position of magnetic domain wall in the X-axis direction in the case where a voltage is applied between the electrodes $7_i$ (i=1, ..., 4) and the magnetic nanowire 4, and between the electrodes $9_j$ (j=1, ..., 5) and the magnetic nanowire 4. FIGS. 4(b) and 4(c) show two patterns of magnetic energy state in the magnetic nanowire 4. FIG. 4(b) shows the state where a voltage Vadd1 (<0) is applied to the electrodes $7_i$ (i=1, ..., 4) so that the potential of the electrodes $7_i$ (i=1, ..., 4) is lower than the potential of the magnetic nanowire 4. As a result, the electrodes $7_i$ (i=1, ..., 4) have a negative charge, and the magnetic nanowire 4 has a positive charge. FIG. 4(c) shows the state where a voltage Vadd2 (<0) is applied to the electrodes $9_j$ (j=1, ..., 5) so that the potential of the electrodes $9_j$ (j=1, ..., 5) is lower than the potential of the magnetic nanowire 4. As a result, the electrodes $9_j$ (j=1, ..., 5) have a negative charge, and the magnetic nanowire 4 has a positive charge.

In the state where no voltage is applied (equilibrium state), the magnetization in the magnetic nanowire 4 is oriented to the direction perpendicular to the direction so that the sum of the magnetostatic energy, which is dependent on the magnetization direction determined by the shape of the section of the Y-Z plane of the magnetic nanowire 4 and the magnetic energy generated as a result of the electron states at the interfaces between the insulating layers $6_i$ (i=1, ..., 4) and the magnetic nanowire 4 and between the insulating layers $8_j$ (j=1, ..., 5) and the magnetic nanowire 4, becomes minimum.

Figure 4:
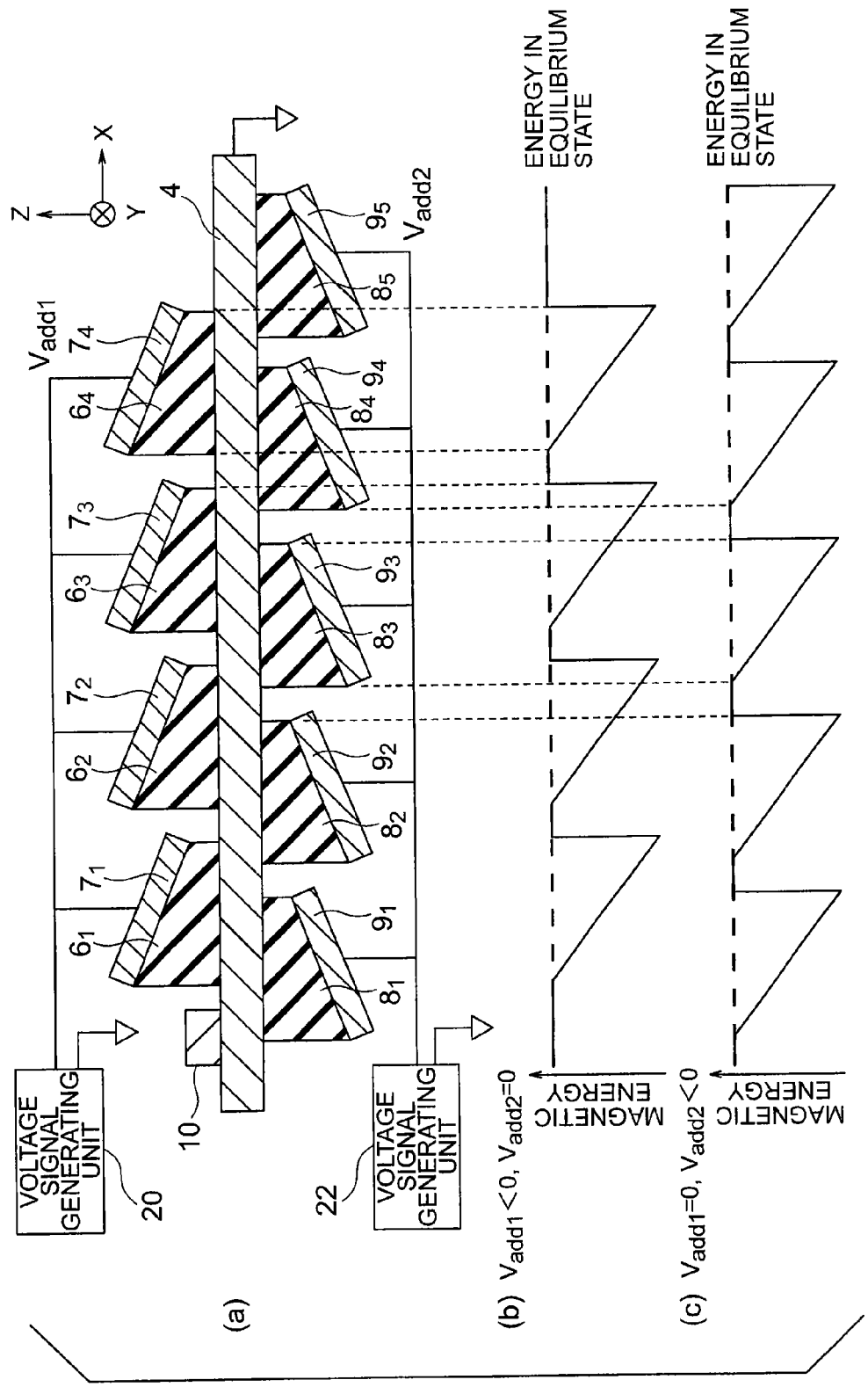
FIGS. 4(a) to 4(c) are drawings for explaining the dependence of magnetic energy of a magnetic nanowire on the position of magnetic domain wall in the X-axis direction.

By using the voltage signal generating unit 20, a voltage is applied so that the electrodes $7_i$ (i=1, ..., 4) have a negative charge and the magnetic nanowire 4 has a positive charge (corresponding to the state shown in FIG. 4(b)). As a result, portions of the magnetic nanowire 4 below the electrodes $7_i$ (i=1, ..., 4) immediately have a magnetic energy with respect to a magnetic domain wall, which is lower than the magnetic energy of the other parts of the magnetic nanowire 4. The magnitude in change of the magnetic energy is dependent on the sign and the quantity of charge attracted to the interface between the insulating layer $6_i$ (i=1, . . . , 4) and the magnetic nanowire 4. Accordingly, the magnitude in change of the magnetic energy is greater in a portion where the thickness of the insulating layer $6_i$ (i=1, . . . , 4) is thinner than that in the other portions. As a result, the distribution of the magnetic energy as shown in FIG. 4(*b*) is obtained by applying a voltage by means of the voltage signal generating unit 20. If there is a magnetic domain wall in a portion where there is a gradient in magnetic energy in the X-axis direction when the aforementioned state is achieved in the magnetic nanowire 4, the magnetic domain wall shifts toward a portion where the magnetic energy is lower. The shift of the magnetic domain wall, caused by the application of the voltage, stops when the magnetic domain wall reaches a portion where the magnetic energy is the lowest in a local area.

Furthermore, by using the voltage signal generating unit 22, a voltage is applied so that the electrodes $9_j$ (j=1, . . . , 5) have a negative charge and the magnetic nanowire 4 has a positive charge (corresponding to the state shown in FIG. 4(*c*)). As a result, portions of the magnetic nanowire 4 below the electrodes $9_j$ (j=1, . . . , 5) immediately have a magnetic energy with respect to a magnetic domain wall, which is lower than the magnetic energy of the other parts of the magnetic nanowire 4. Accordingly, the distribution of the magnetic energy as shown in FIG. 4(*c*) is obtained by applying a voltage by means of the voltage signal generating unit 22. If there is a magnetic domain wall in a portion where there is a gradient in magnetic energy in the X-axis direction when the aforementioned state is achieved in the magnetic nanowire 4, the magnetic domain wall shifts toward a portion where the magnetic energy is lower. The shift of the magnetic domain wall, caused by the application of the voltage, stops when the magnetic domain wall reaches a portion where the magnetic energy is the lowest in a local area.

Figure 5:
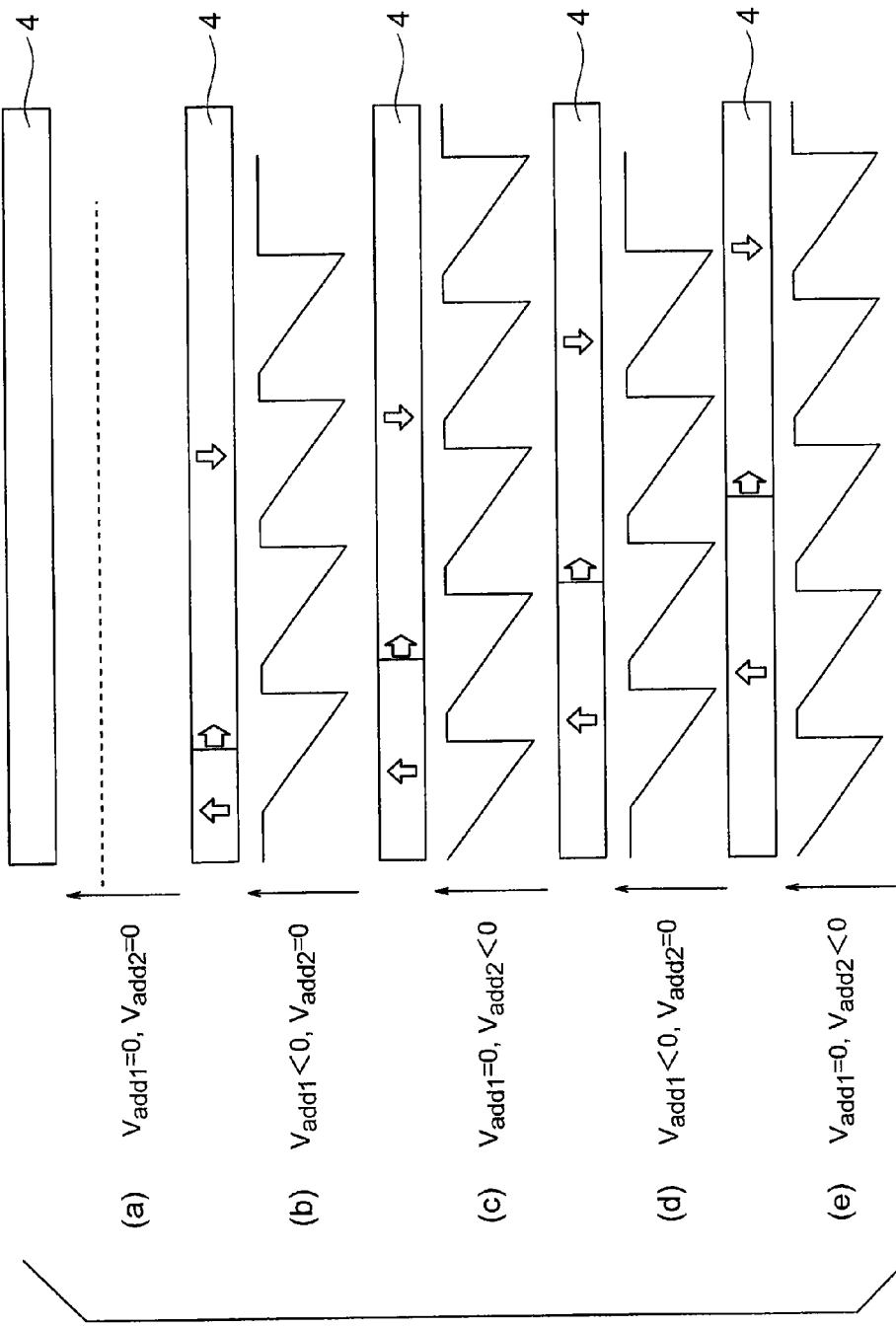
FIGS. 5(a) to 5(e) are drawings for explaining the shift of a magnetic domain wall in a magnetic nanowire.

It is possible to shift the magnetic domain wall from one end of the magnetic nanowire 4 to the other end using the cyclic operation in which voltages apply to the electrodes $7_i$ (i=1, . . . , 4) with the insulating layers $6_i$ (i=1, . . . , 4), and alternatively to the electrodes $9_j$ (j=1, . . . , 5) with the insulating layers $8_j$ (j=1, . . . , 5), which are capable of shifting the magnetic domain wall locally when a voltage is applied thereto. FIGS. 5(*a*) to 5(*e*) are drawings for explaining how a magnetic domain wall in the magnetic nanowire 4 is shifted by using the degree (high or low) of magnetic energy with respect to the magnetic domain wall, which was explained with reference to FIGS. 4(*a*) to 4(*c*). Each drawing shows a profile of magnetic energy with respect to the magnetic domain wall in the magnetic nanowire 4, and the position of the magnetic domain wall. FIG. 5(*a*) shows the initial state of the magnetic domain wall in the magnetic nanowire 4. Time passes from FIG. 5(*a*) to FIG. 5(*e*). The states shown in FIGS. 5(*a*) to 5(*e*) are called the initial state, the second state, the third state, the fourth state, and the fifth state, respectively. As examples, FIGS. 5(*a*) to 5(*e*) each show a case where there are four electrodes $7_i$ (i=1, . . . , 4) and four insulating layers $6_i$ (i=1, . . . , 4), and there are five electrodes $9_j$ (j=1, . . . , 5) and five insulating layers $8_j$ (j=1, . . . , 5).

In the initial state shown in FIG. 5(*a*), the magnetic domain wall exists immediately under the first electrode $7_1$ and the first insulating layer $6_1$. From this state, a first voltage and a second voltage are repeatedly applied.

(Application of First Voltage)

The voltage Vadd1 (<0) is applied, with the voltage signal generating unit 20, to the electrodes $7_i$ (i=1, . . . , 4) and the magnetic nanowire 4 so that the potential of the electrodes $7_i$ (i=1, . . . , 4) is lower than the potential of the magnetic nanowire 4. At this time, the portions of the magnetic nanowire 4 immediately under the insulating layers $6_i$ (i=1, . . . , 4) are in the second state in which the portions have a gradient magnetic energy with respect to the magnetic domain wall, as shown in FIG. 5(*b*). As a result, the magnetic domain wall shifts in a direction going down the gradient of the magnetic energy, and stops at a portion where the magnetic energy is the lowest, locally.

(Application of Second Voltage)

The voltage Vadd2 (<0) is applied, with the voltage signal generating unit 22, to the electrodes $9_j$ (j=1, . . . , 5) and the magnetic nanowire 4 so that the potential of the electrodes $9_j$ (j=1, . . . , 5) is lower than the potential of the magnetic nanowire 4. As a result, the portions of the magnetic nanowire 4 immediately under the insulating layers $8_j$ (j=1, . . . , 5) are in the third state in which the portions have a gradient magnetic energy with respect to the magnetic domain wall, as shown in FIG. 5(*c*). As a result, the magnetic domain wall shifts in the direction going down the gradient of the magnetic energy, and stops at a portion where the magnetic energy is the lowest, locally.

By repeating the application of the first voltage and the application of the second voltage, it is possible to shift the magnetic domain wall only by applying voltages, as shown in FIGS. 5(*a*) to 5(*e*).

(Write Operation)

The write operation of the magnetic memory 1 according to the first embodiment is going to be described below. The write operation is performed by combining the operation of moving the magnetic domain wall and the operation of switching magnetization.

FIGS. 6 to 17 are drawings for explaining the write operation of the magnetic memory 1. Starting from FIG. 6, the write operation is going to be sequentially described. It is assumed that each portion in the magnetic nanowire 4 where the magnetic domain has a downward magnetization direction in each drawing (the negative direction on the Z axis) stores data "0." It is also assumed that each portion in the magnetic nanowire 4 where the magnetic domain has an upward magnetization direction in each drawing (the positive direction on the Z axis) stores data "1." The magnetization directions in the above definitions can be reversed.

Figure 6:
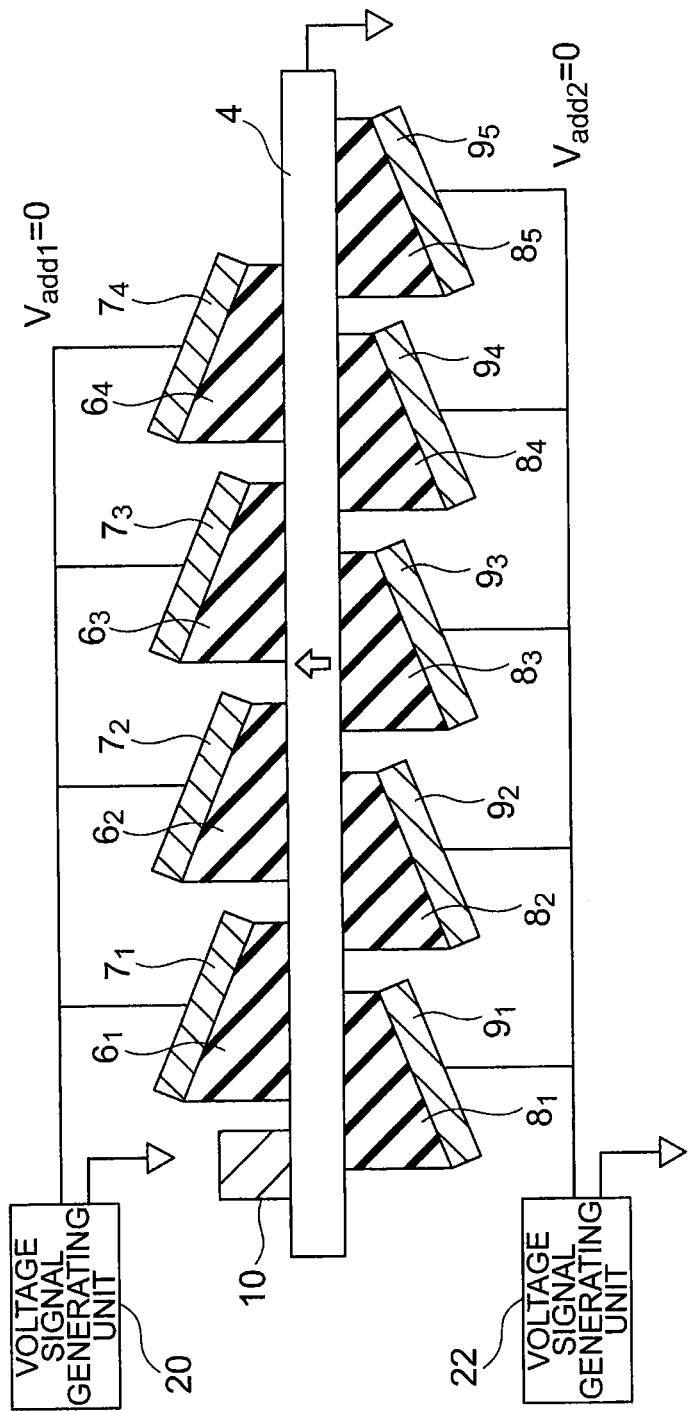
FIG. 6 is a drawing for explaining the write operation of the magnetic memory according to the first embodiment.

For simple explanation, it is assumed that there are four electrodes $7_i$ (i=1, . . . , 4) and four insulating layers $6_i$ (i=1, . . . , 4), and five electrodes $9_j$ (j=1, . . . , 5) and five insulating layers $8_j$ (j=1, . . . , 5) in FIGS. 6 to 17. In this case, the magnetic memory 1 is capable of recording 4-bit data. The number of the electrodes $7_i$ (i=1, . . . ), the number of the insulating layers $6_i$ (i=1, . . . ), the number of the electrodes $9_j$ (j=1, . . . ), and the number of the insulating layers $8_j$ (j= 1, . . . ) are not limited to those mentioned above. In the initial state, the magnetization of the entire magnetic nanowire 4 is in the upward direction (FIG. 6). In other words, data "1" is stored in the magnetic memory 1.

Figure 7:
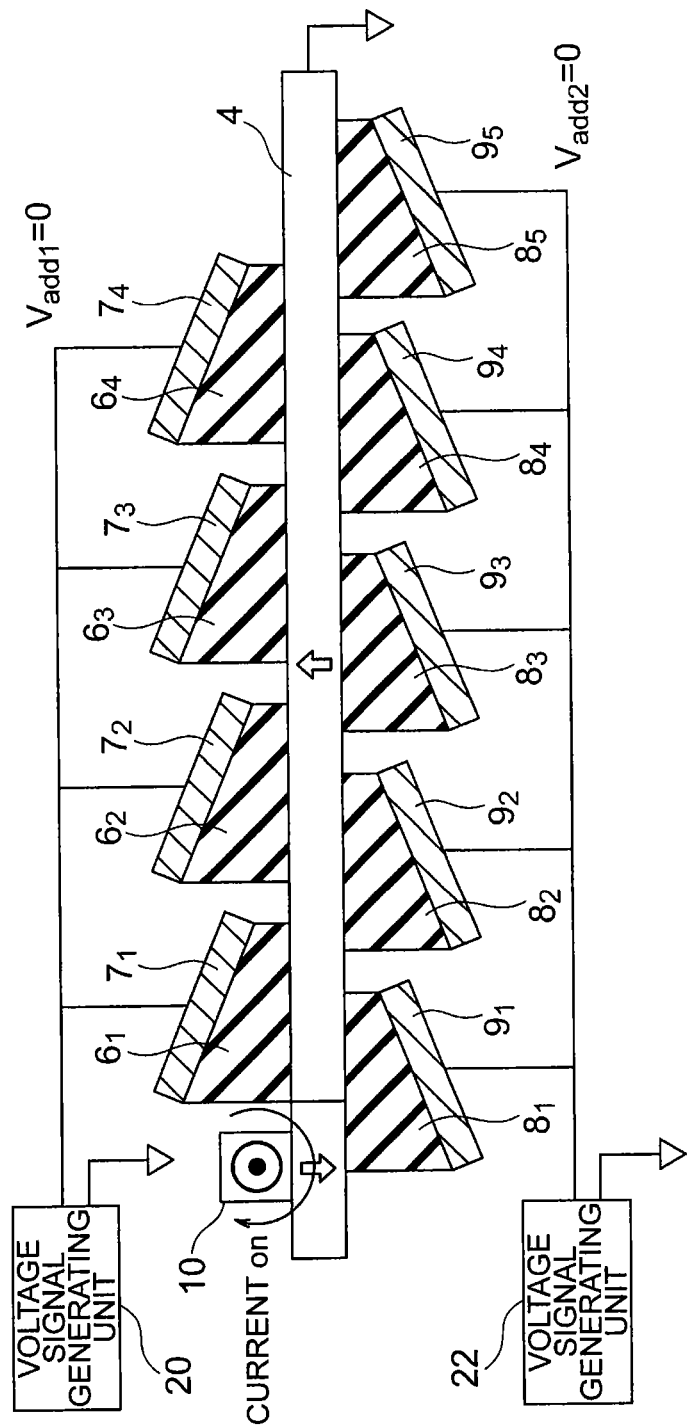
FIG. 7 is a drawing for explaining the write operation of the magnetic memory according to the first embodiment.
Figure 8:
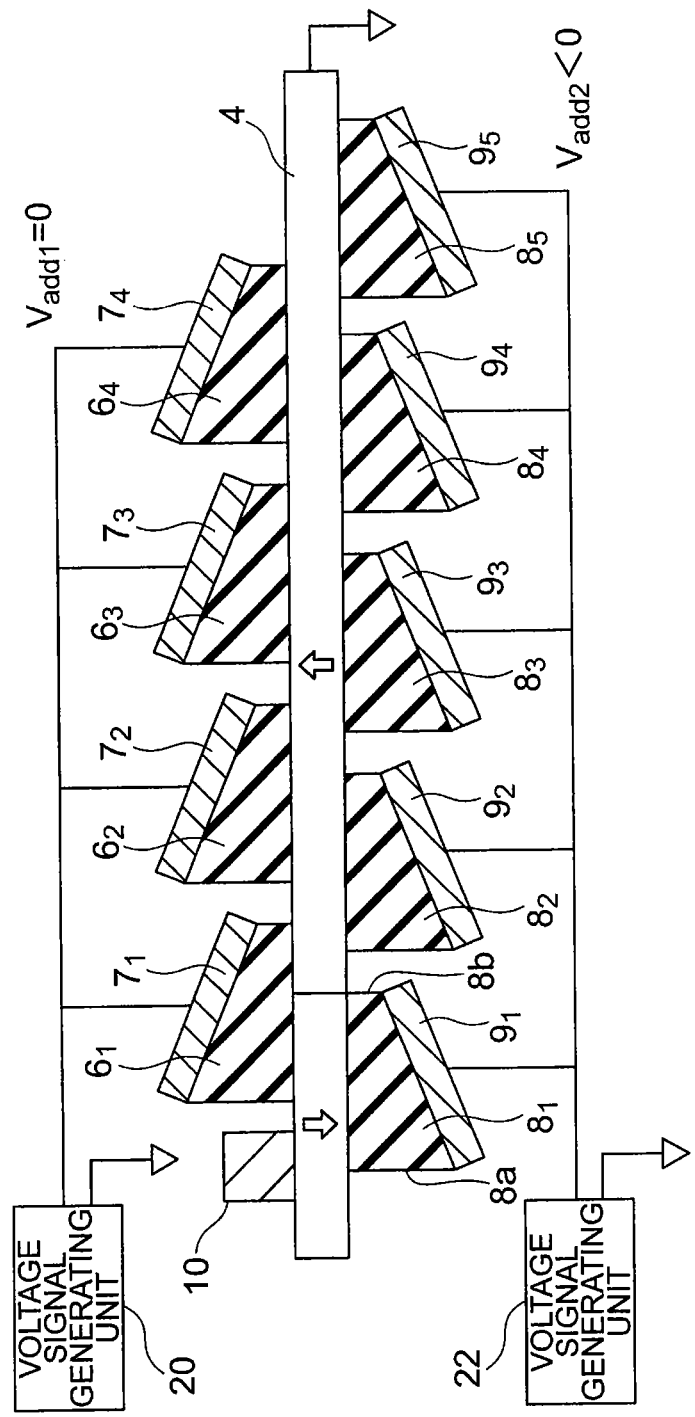
FIG. 8 is a drawing for explaining the write operation of the magnetic memory according to the first embodiment.
Figure 9:
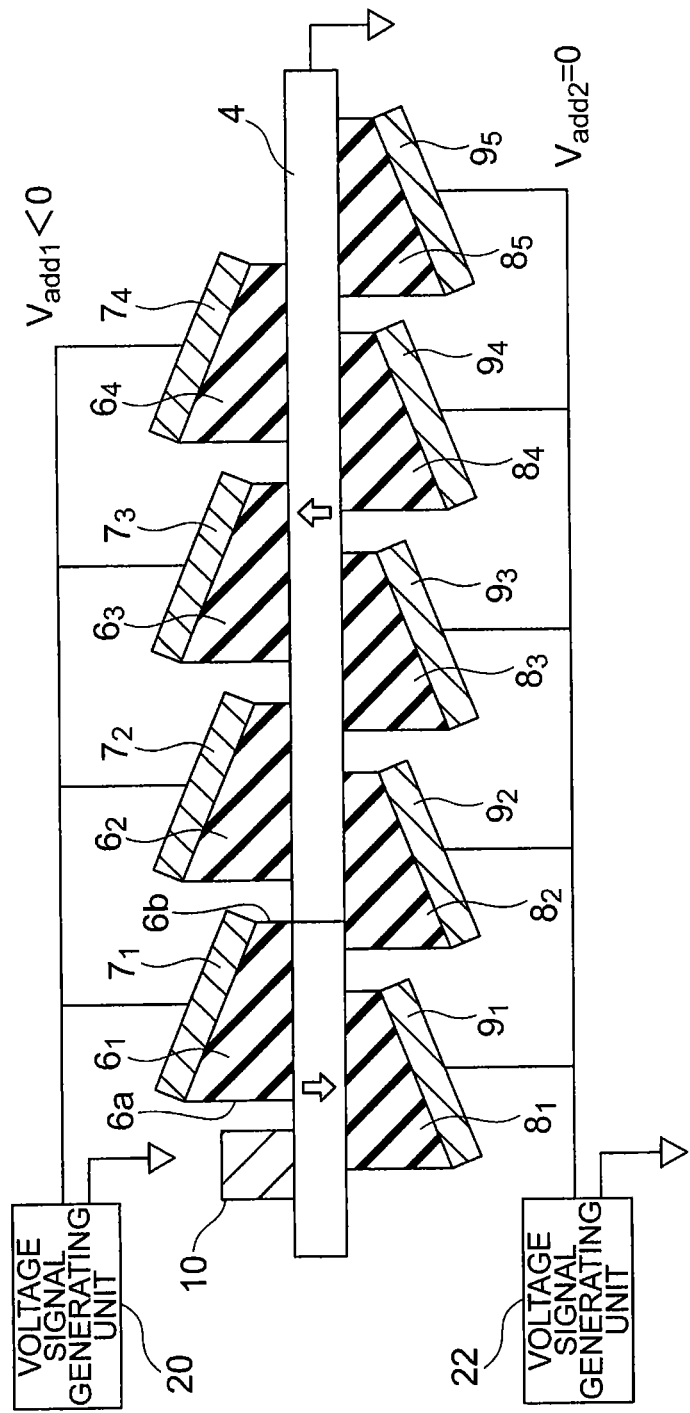
FIG. 9 is a drawing for explaining the write operation of the magnetic memory according to the first embodiment.

First, a current is caused to flow through the electrode 10 to generate an induced field from the electrode 10. Due to this induced field, a portion of the magnetic nanowire 4 immediately above the first insulating layer $8_1$ has a magnetization in the downward direction in the drawing (FIG. 7). In other words, data "0" is stored in this portion of the magnetic nanowire 4.

Next, the voltage Vadd2 (<0) is applied so that the potential of the electrodes $9_j$ (j=1, . . . , 5) is lower than the potential of the magnetic nanowire 4. As a result, the magnetic domain wall shifts in the direction going down the gradient of the magnetic energy, and stops at a portion where the magnetic energy is the lowest (around the right end $8b$ of the insulating layer $8_1$) (FIG. 8), locally.

Figure 10:
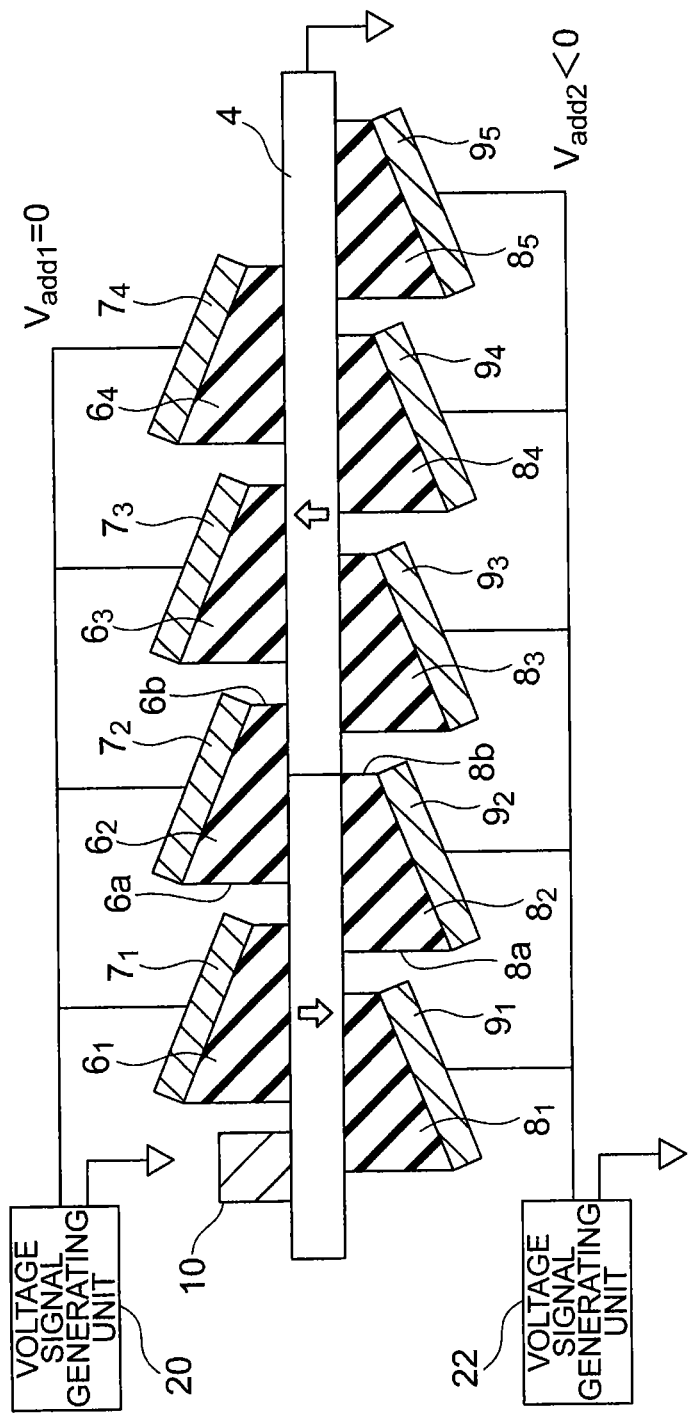
FIG. 10 is a drawing for explaining the write operation of the magnetic memory according to the first embodiment.
Figure 11:
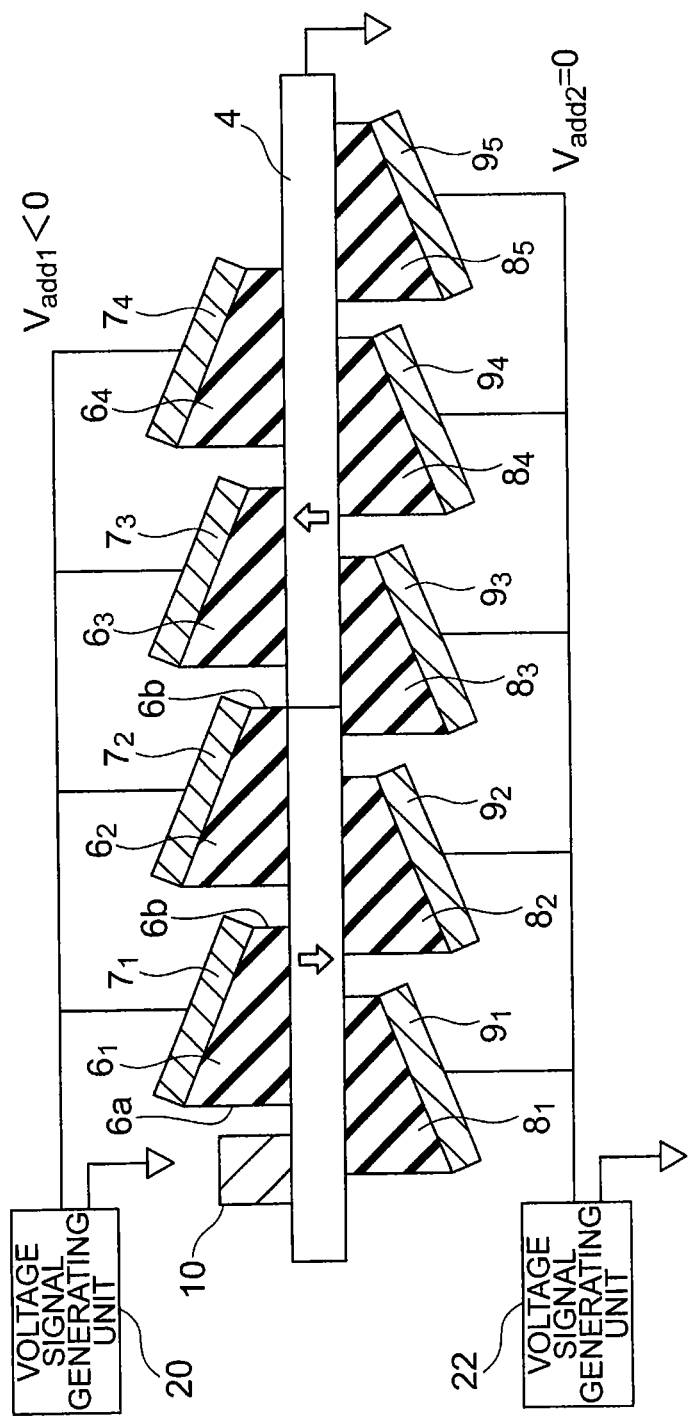
FIG. 11 is a drawing for explaining the write operation of the magnetic memory according to the first embodiment.

Then, the voltage Vadd1 (<0) is applied so that the potential of the electrodes $7_i$ (i=1, ..., 4) is lower than the potential of the magnetic nanowire 4. As a result, the magnetic domain wall shifts in the direction going down the gradient of the magnetic energy, and stops at a portion where the magnetic energy is the lowest (around the right end 6b of the insulating layer $6_1$) (FIG. 9) locally. By repeating the above cycle, the magnetic domain wall shifts to a portion around the right end 6b of the insulating layer $6_2$ (FIG. 10 and FIG. 11). By the foregoing operations, 2 bits are overwritten, i.e., the information "1100" is stored in the magnetic nanowire 4.

Figure 12:
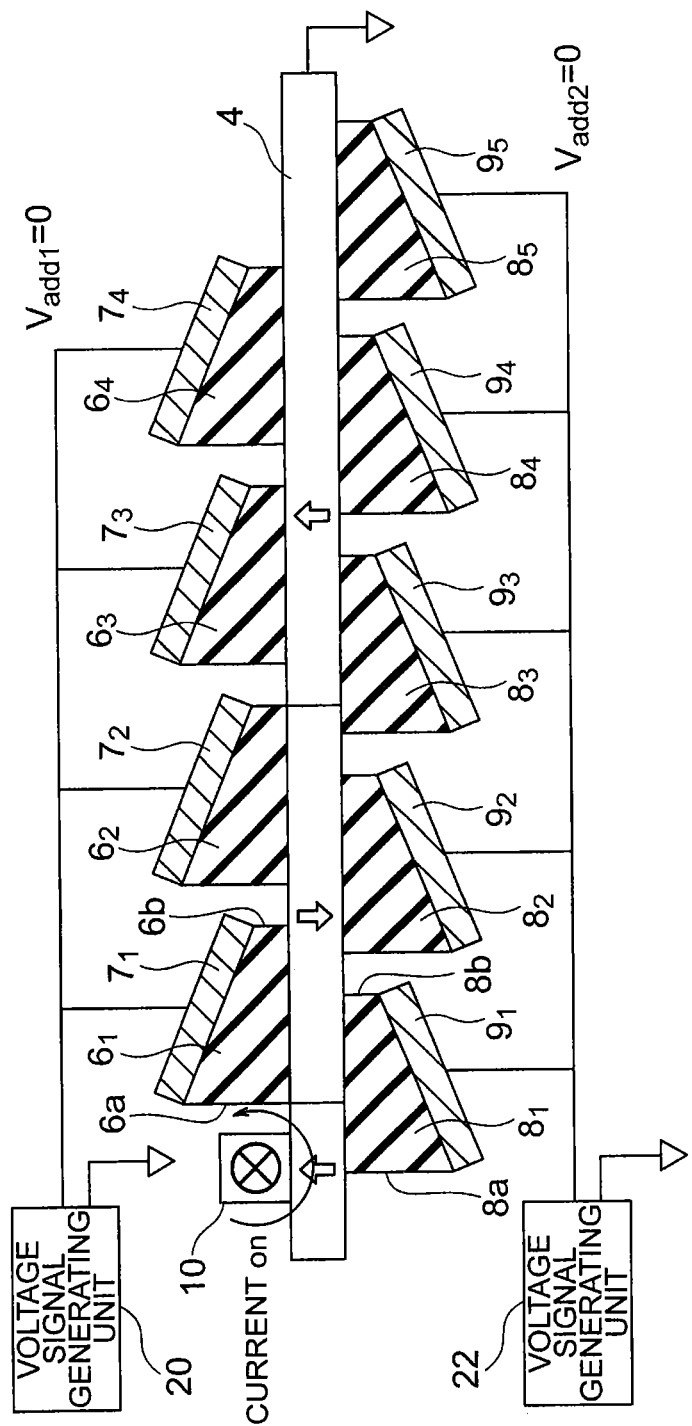
FIG. 12 is a drawing for explaining the write operation of the magnetic memory according to the first embodiment.

Thereafter, a current is caused to flow through the electrode 10 again to generate an induced field from the electrode 10. Due to this induced field, a portion of the magnetic nanowire 4 immediately above the insulating layer $8_1$ has a magnetization in the upward direction in the drawing (FIG. 12).

Figure 13:
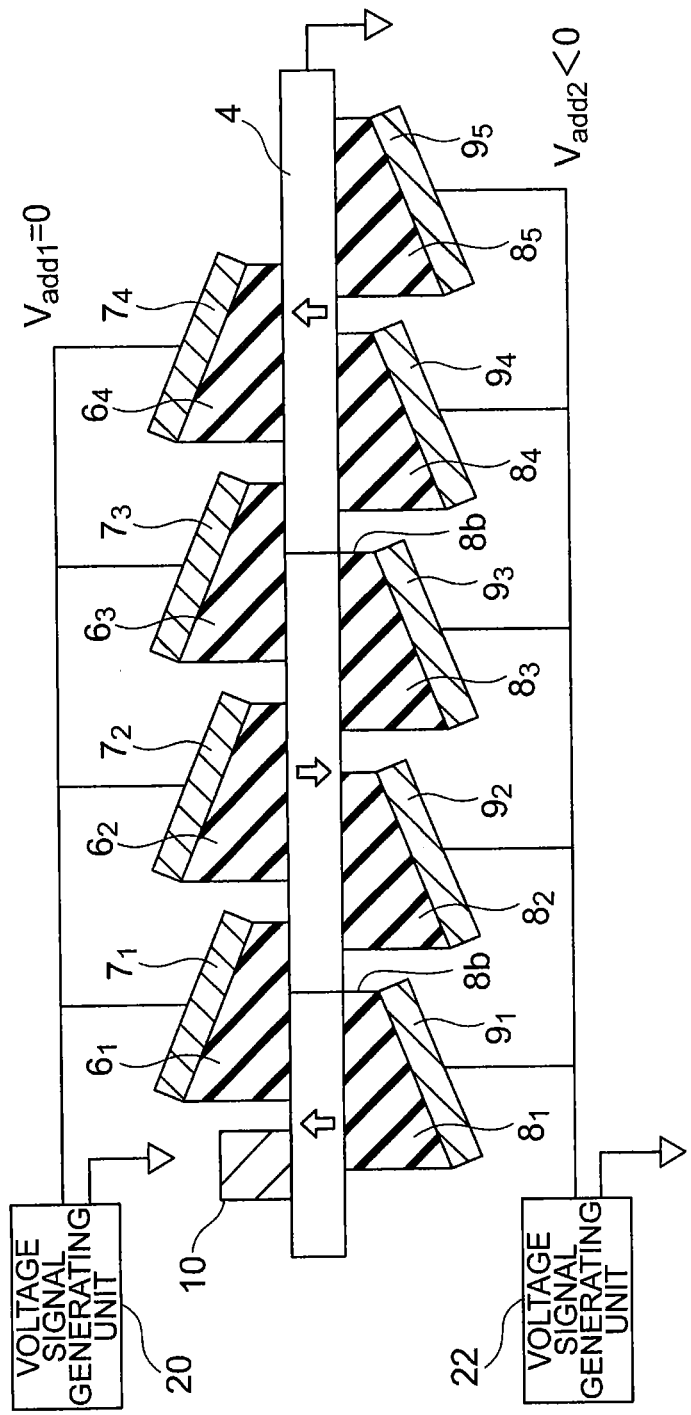
FIG. 13 is a drawing for explaining the write operation of the magnetic memory according to the first embodiment.

Then, the voltage Vadd2 (<0) is applied so that the potential of the electrodes $9_j$ (j=1, ..., 5) is lower than the potential of the magnetic nanowire 4. As a result, the magnetic domain wall introduced in the operation shown in FIG. 12 shifts in the direction going down the gradient of the magnetic energy, and stops at a portion around the right end 8b of insulating layer $8_1$, and the magnetic domain wall previously formed stops at a portion around the right end 8b of the insulating layer $8_3$ (FIG. 13).

Figure 14:
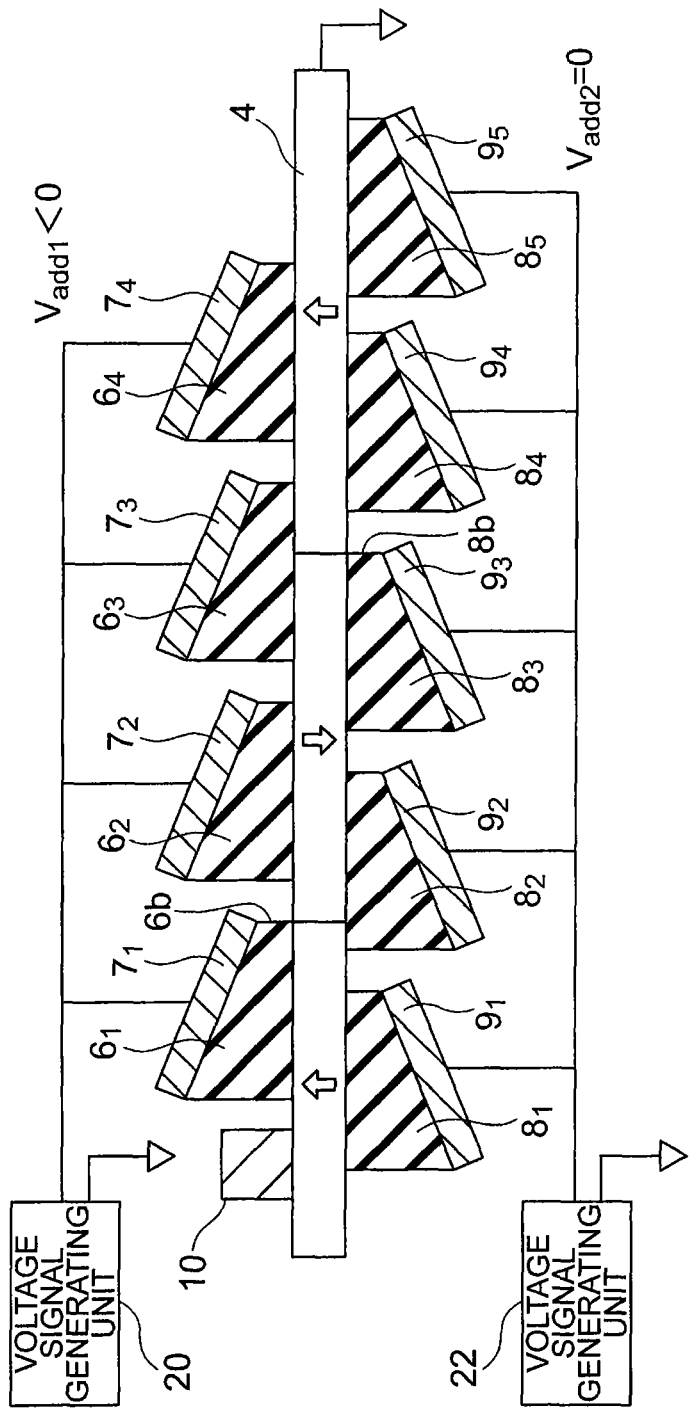
FIG. 14 is a drawing for explaining the write operation of the magnetic memory according to the first embodiment.

Next, the voltage Vadd1 (<0) is applied so that the potential of the first electrodes $7_i$ (i=1, ..., 4) is lower than the potential of the magnetic nanowire 4. Then, the magnetic domain wall formed in the operation shown in FIG. 12 shifts in the direction going down the gradient of the magnetic energy, and stops at a portion around the right end 6b of the insulating layer $6_1$, and the magnetic domain wall previously formed stops at a portion around the right end 8b of the insulating layer $8_3$ (FIG. 14). By the foregoing operation, 3 bits are overwritten, and at this point, the information "1001" is stored in the magnetic nanowire 4.

Figure 15:
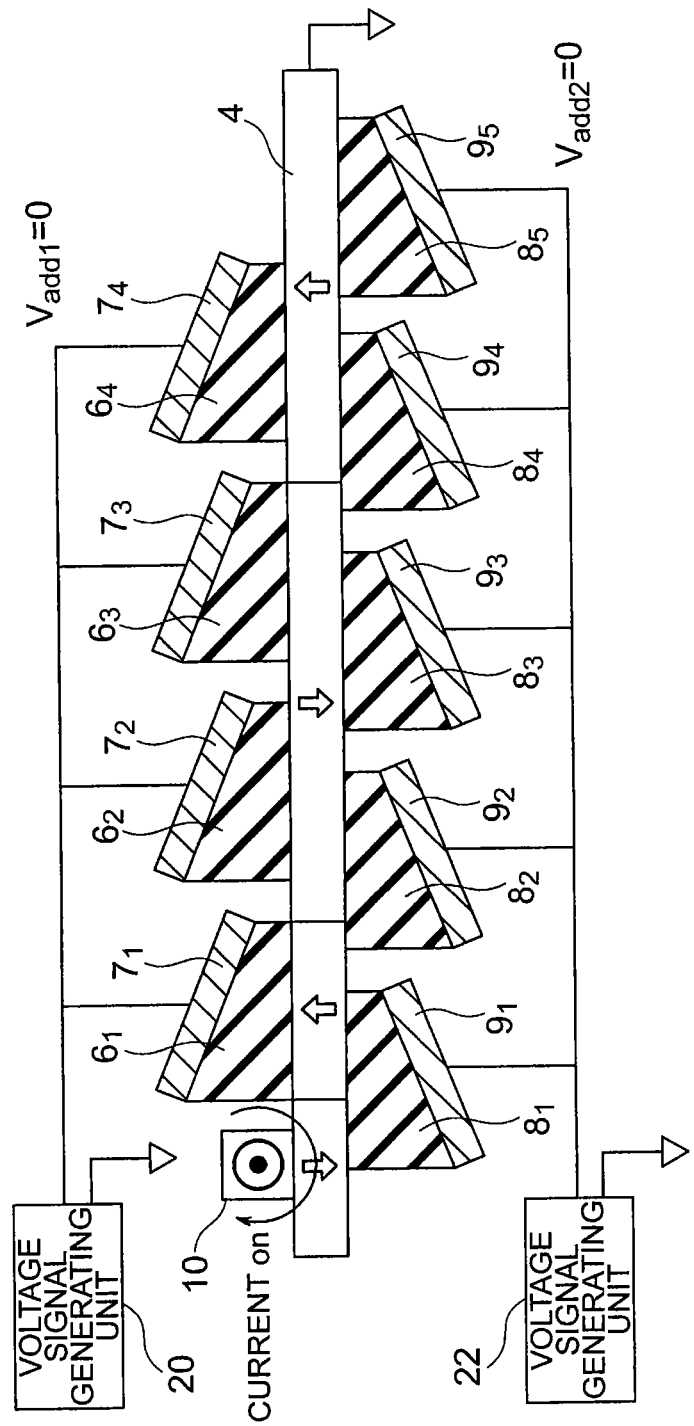
FIG. 15 is a drawing for explaining the write operation of the magnetic memory according to the first embodiment.

Thereafter, a current is caused to flow through the electrode 10 again to generate an induced field from the electrode 10. Due to this induction field, a portion of the magnetic nanowire 4 immediately above the insulating layer $8_1$ has a magnetization in the downward direction in the drawing (FIG. 15).

Figure 16:
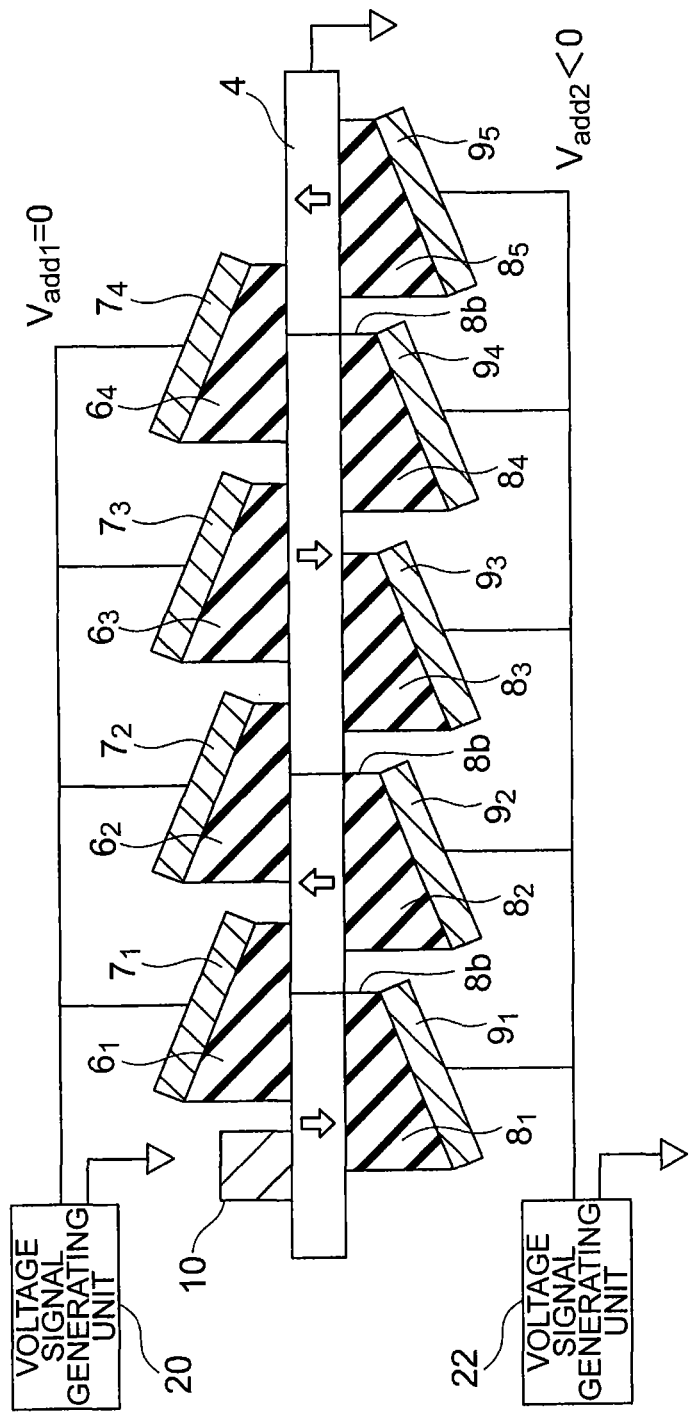
FIG. 16 is a drawing for explaining the write operation of the magnetic memory according to the first embodiment.

Then, the voltage Vadd2 (<0) is applied so that the potential of the electrodes $9_j$ (j=1, ..., 5) is lower than the potential of the magnetic nanowire 4. As a result, the magnetic domain wall formed in the operation shown in FIG. 15 shifts in the direction going down the gradient of the magnetic energy, and stops at a portion around the right end 8b of the insulating layer $8_1$, the magnetic domain wall formed in the operation shown in FIG. 12 shifts to a portion around the right end 8b of the insulating layer $8_2$, and the magnetic domain wall formed in the operation shown in FIG. 6 stops at a portion around the right end 8b of the insulating layer $8_4$ (FIG. 16).

Figure 17:
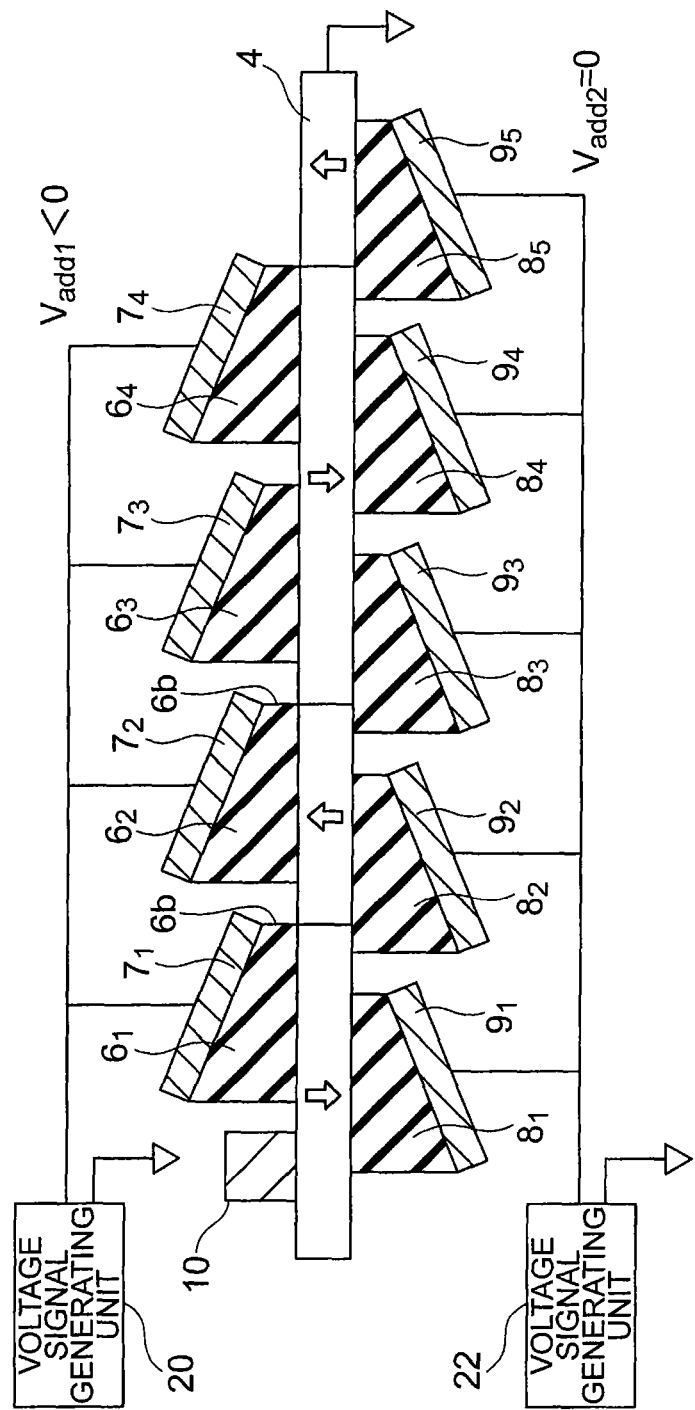
FIG. 17 is a drawing for explaining the write operation of the magnetic memory according to the first embodiment.

Then, the voltage Vadd1 (<0) is applied so that the potential of the electrodes $7_i$ (i=1, ..., 4) is lower than the potential of the magnetic nanowire 4. As a result, the magnetic domain wall formed in the operation shown in FIG. 15 shifts in the direction going down the gradient of the magnetic energy and stops at a portion around the right end 6b of the insulating layer $6_1$, the magnetic domain wall formed in the operation shown in FIG. 12 shifts to a portion around the right end 6b of the insulating layer $6_2$, and the magnetic domain wall formed in the operation shown in FIG. 6 shifts to a portion around the right end 6b of the insulating layer $6_4$ (FIG. 17). By the foregoing operation, all of 4 bits in the data are overwritten, and at this point, the data "0010" is stored in the magnetic nanowire 4.

(Read Operation)

Figure 18:
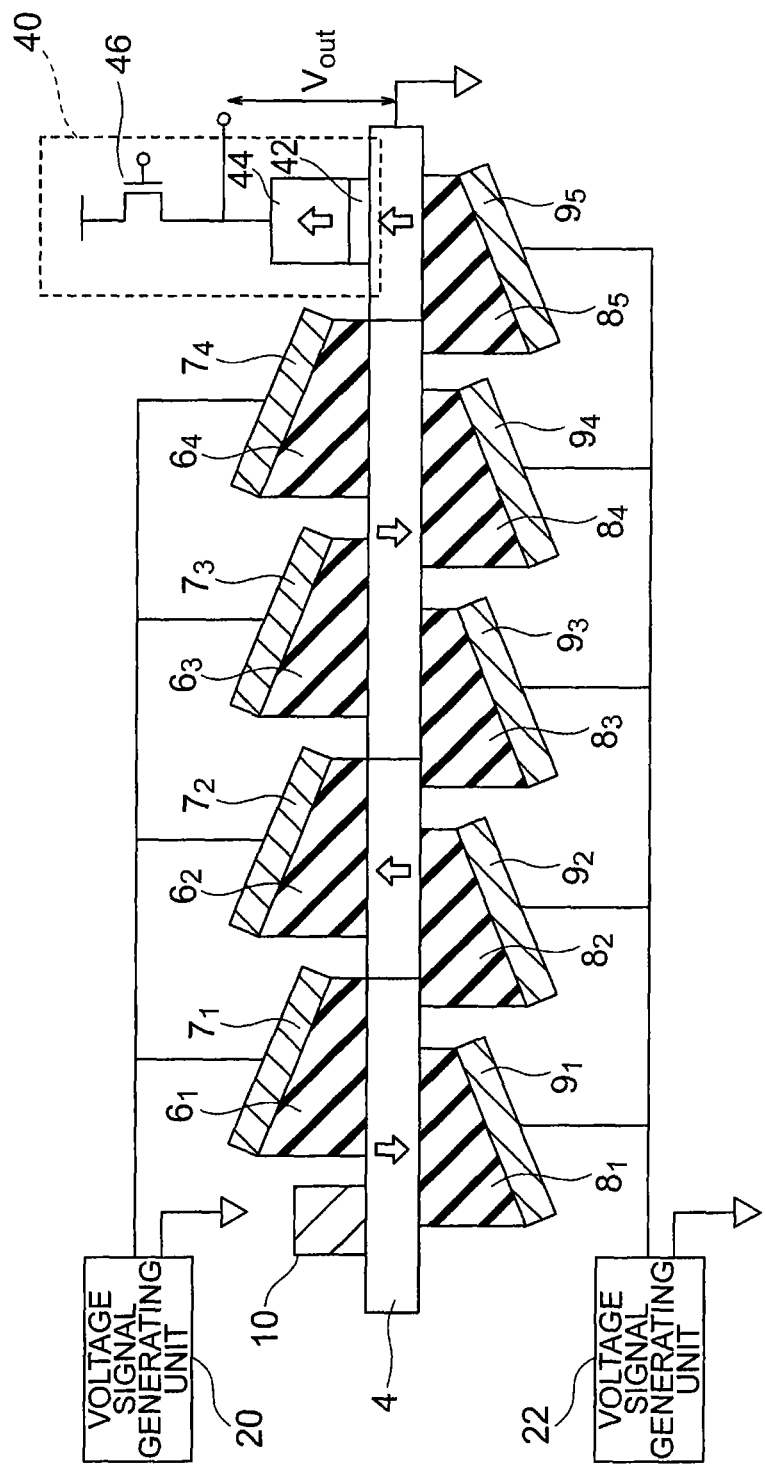
FIG. 18 is a drawing for explaining a reading unit of the magnetic memory according to the first embodiment.

Next, the read operation of the magnetic memory 1 according to the first embodiment is going to be described below. FIG. 18 shows the structure for reading out the information from the magnetic memory 1 according to this embodiment.

As shown in FIG. 18, the magnetic memory 1 further includes a reading unit 40 for reading out magnetization information on the magnetic nanowire 4. The reading unit 40 includes, for example, an insulating layer for tunneling barrier 42 provided onto the magnetic nanowire 4, a ferromagnetic layer 44 provided onto the insulating layer for tunneling barrier 42, in which magnetization is directed upward in the drawing, and an n-channel transistor 46, in which a source is connected to the ferromagnetic layer 44. In order to detect magnetization information, a current is caused to flow from the ferromagnetic layer 44 toward the magnetic nanowire 4. The magnetization information written to the magnetic nanowire 4 is read out based on a value of voltage drop (Vout) caused by the magnetic resistance.

The detail of the read operation of the magnetic memory 1 is going to be described with FIGS. 19 to 23(b), as references. The relationship between the output voltage read by the reading unit 40 and the number (cycles) of read operations is shown in FIGS. 20 to 23(b). The cycles 1 to 4 correspond to the descriptions with reference to FIGS. 20 to 23(b).

Figure 19:
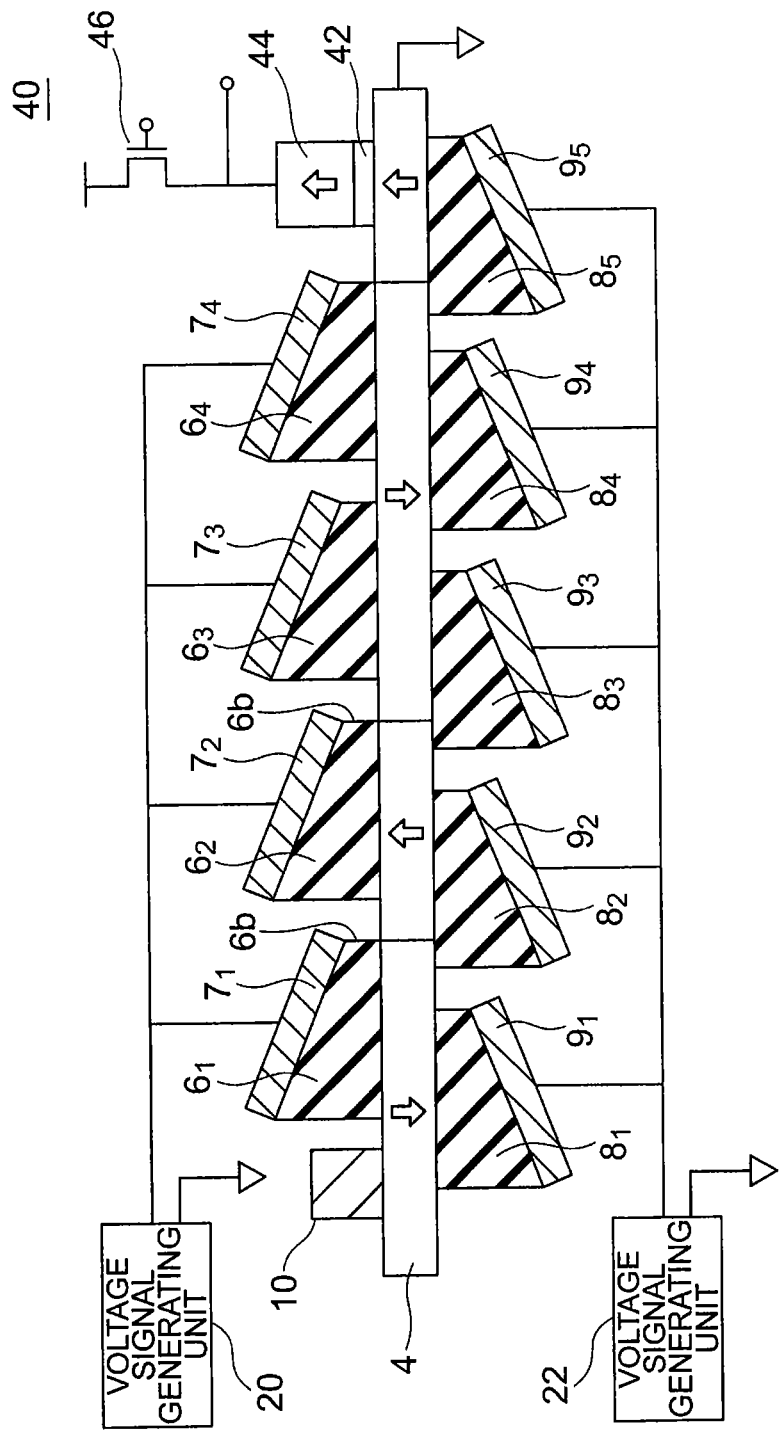
FIG. 19 is a drawing for explaining the read operation of the magnetic memory according to the first embodiment.
Figure 20:
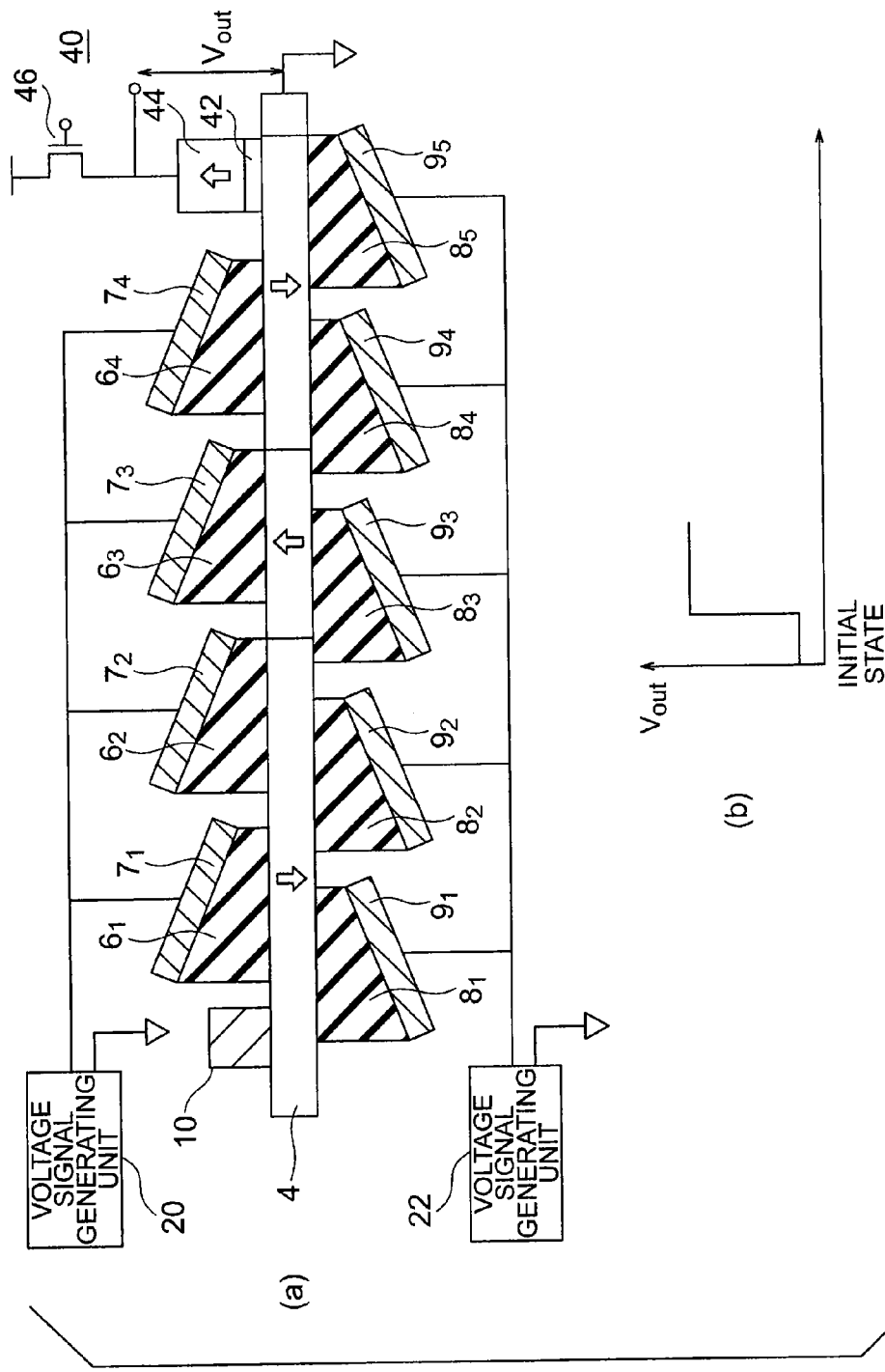
FIGS. 20(a) and 20(b) are drawings for explaining the read operation of the magnetic memory according to the first embodiment.

It is assumed that in the initial state, the data "0010" is written in the magnetic memory 1 (FIG. 19).

A cycle of operation includes the application of the voltage Vadd2 (<0) so that the potential of the electrodes $9_j$ (j=1, ..., 5) is lower than the potential of the magnetic nanowire 4, and the application of the voltage Vadd1 (<0) so that the potential of the electrodes $7_i$ (i=1, ..., 4) is lower than the potential of the magnetic nanowire 4. By the foregoing operation, for example, the magnetic domain wall shifts from a portion around the right end 6b of the insulating layer $6_1$ to a portion around the right end 6b of the insulating layer $6_2$.

FIGS. 20(a) and 20(b) show the state where a cycle of operation has been performed on the magnetic memory 1 in the initial state shown in FIG. 19. Each magnetic domain wall shifts to right by a length corresponding to that of one of the insulating layers $6_1$ to $6_4$, and the direction of the magnetization of the magnetic nanowire 4 immediately under the reading unit 40 changes from upward to downward. The magnetization in the downward direction corresponds to "0" of the most significant bit stored in the initial state. Since the magnetization of the ferromagnetic layer 44 is opposite to the magnetization of the magnetic nanowire 4, resistance therebetween is relatively high, due to the tunneling magnetoresistance, and then Vout becomes to be in a "High" state (FIG. 20(b)).

Figure 21:
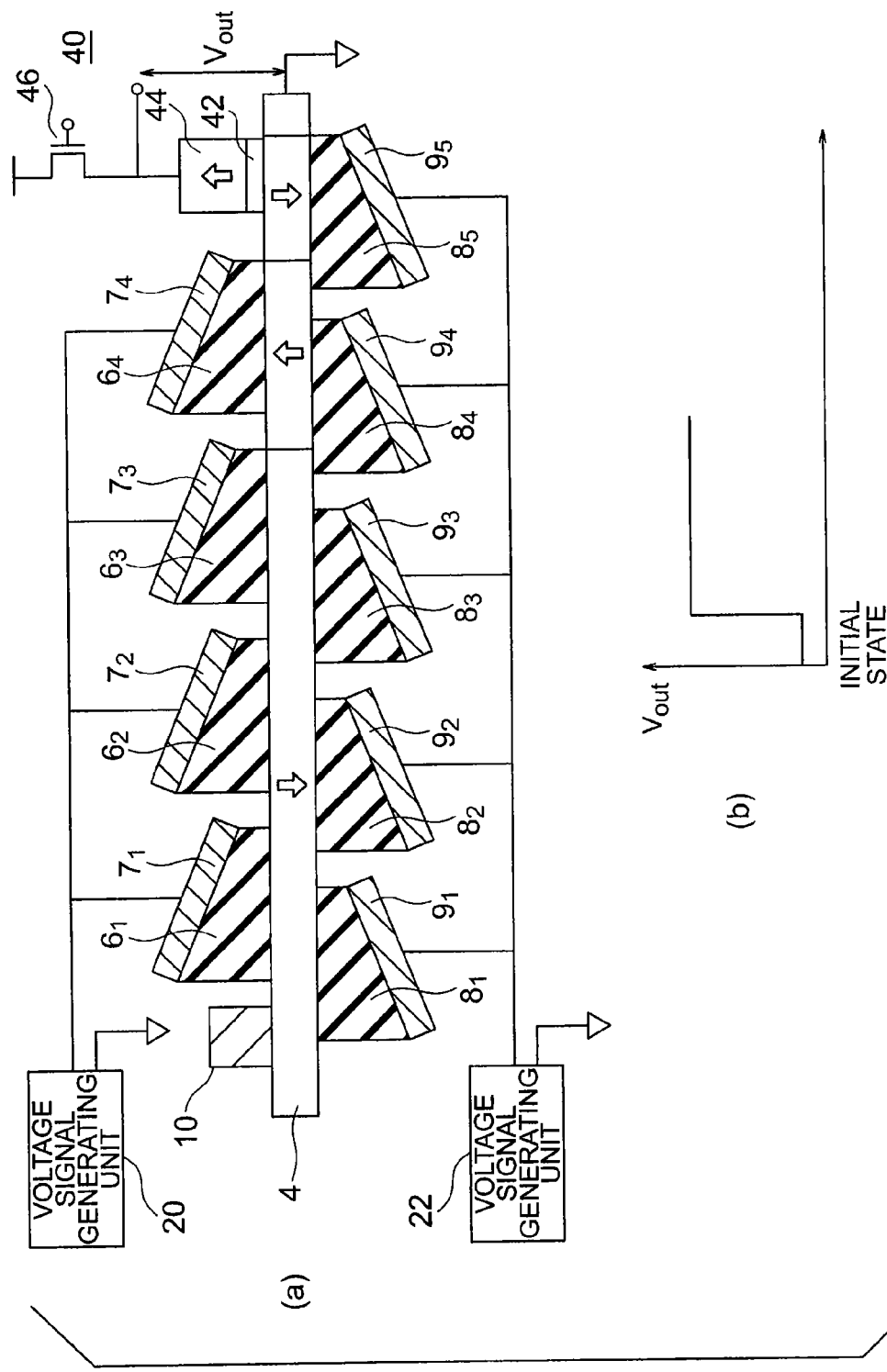
FIGS. 21(a) and 21(b) are drawings for explaining the read operation of the magnetic memory according to the first embodiment.
Figure 22:
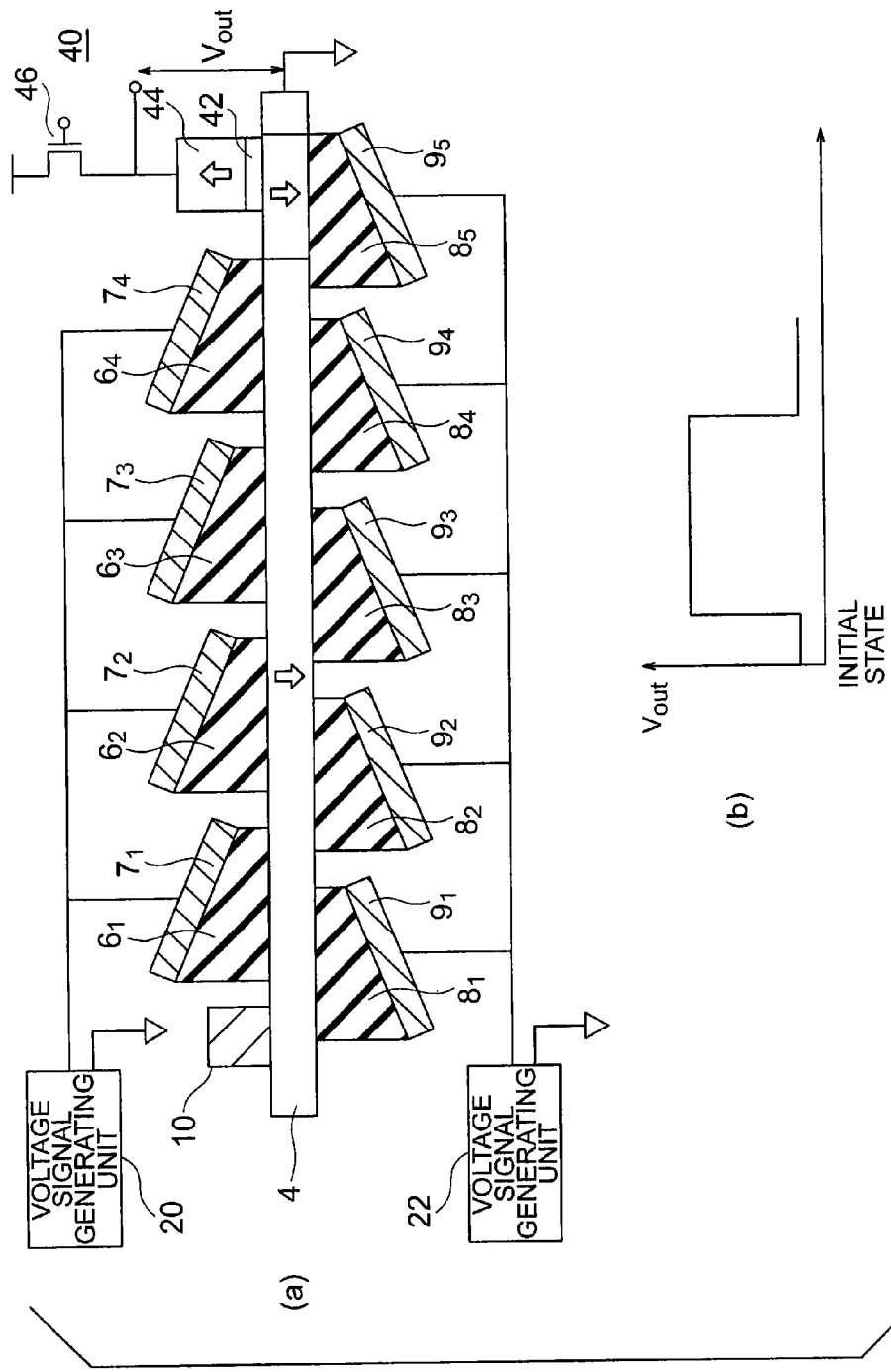
FIGS. 22(a) and 22(b) are drawings for explaining the read operation of the magnetic memory according to the first embodiment.
Figure 23:
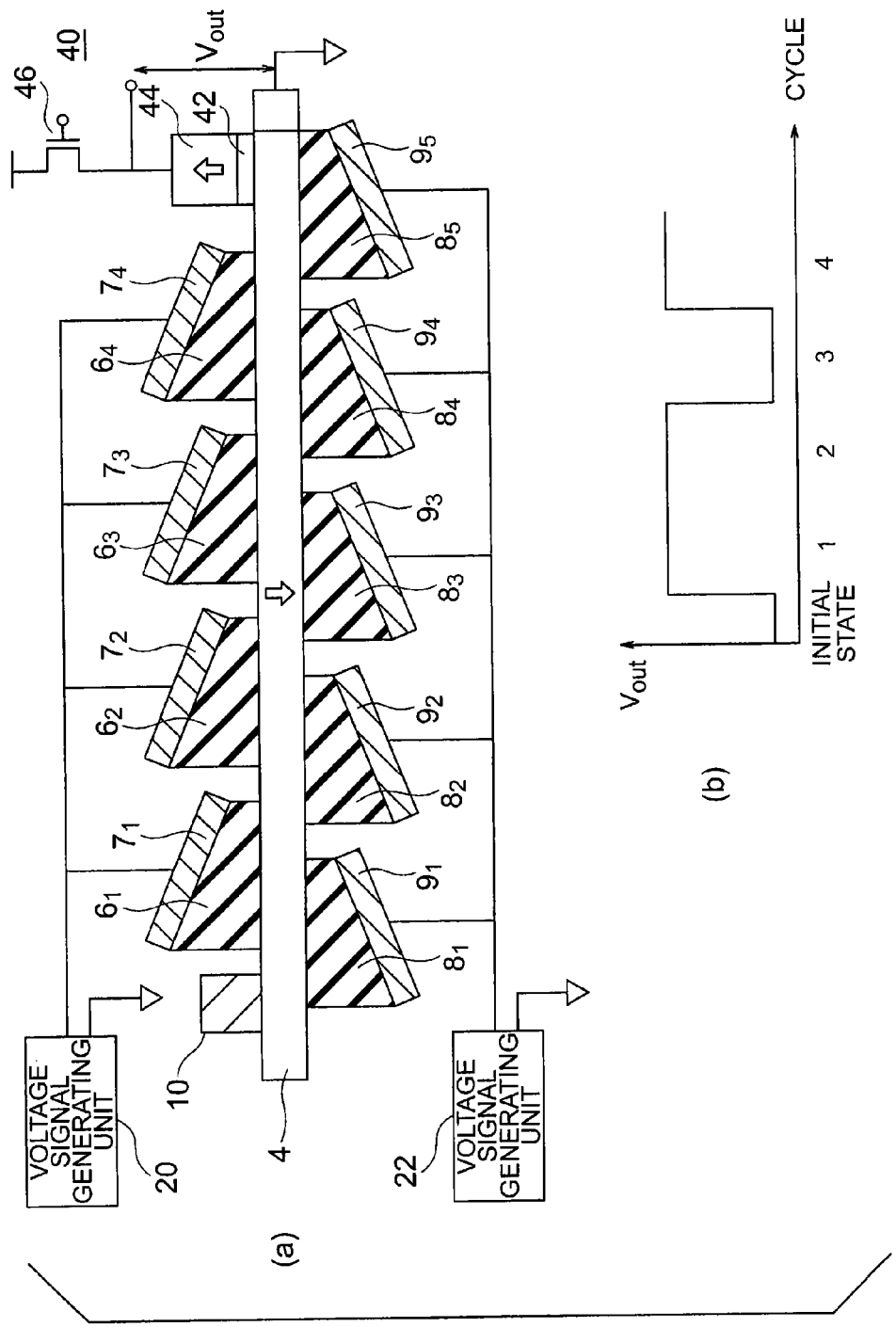
FIGS. 23(a) and 23(b) are drawings for explaining the read operation of the magnetic memory according to the first embodiment.

While the aforementioned one cycle of operation is repeated, the magnetic domain walls are shifted in each cycle, and the states thereof change as shown in FIGS. 21 to 23. By measuring the magnetoresistive effect in the reading unit 40 in each operation, bit information that is "0010" in the initial state stored in the magnetic nanowire 4 is outputted as Vout in the first-in-first-out (FIFO) manner. Incidentally, FIGS. 20(b), 21(b), 22(b), and 23(b) show the waveform of Vout read in the operations shown in FIGS. 20(a), 21(a), 22(a), and 23(a), respectively.

Thus, by the operations for applying voltage, the magnetic memory 1 reads data bit by bit. Therefore, the magnetic memory 1 is capable of reading stored data accurately.

Figure 24:
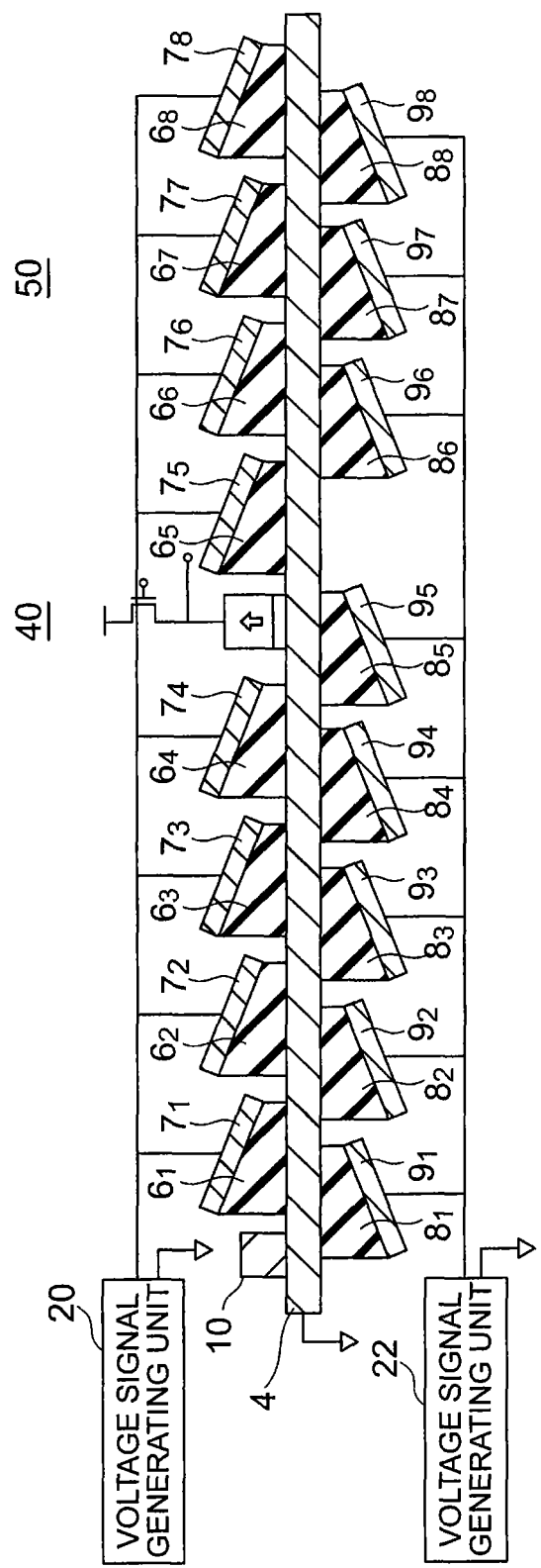
FIG. 24 is a cross-sectional view showing a magnetic memory according to a first modification of the first embodiment.

As shown in FIG. 24, the magnetic nanowire 4 may further be extended, and a buffer storage unit 50 may be provided to the right side of the reading unit 40. By providing the buffer storage unit 50, it is also possible to prevent the data of the magnetic memory 1 from being broken during a reading operation.

Figure 25:
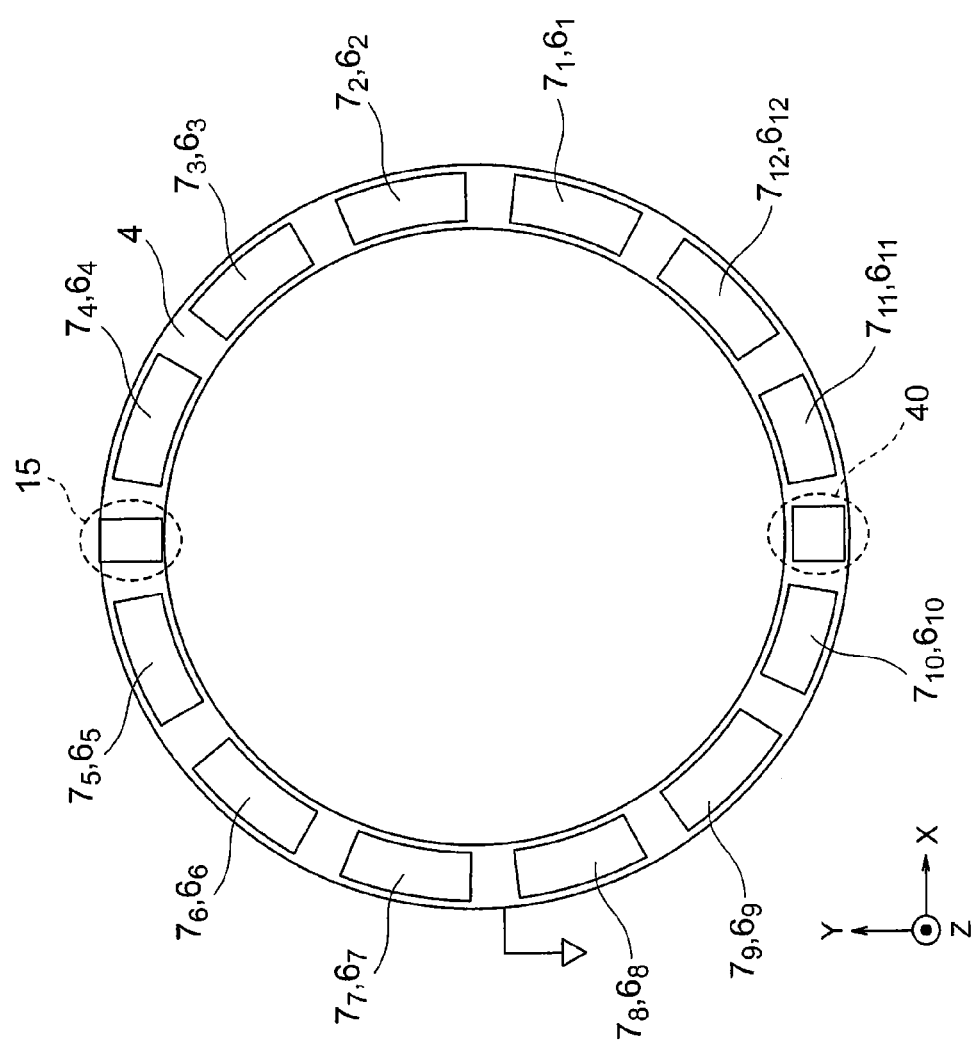
FIG. 25 is a top view showing a magnetic memory according to a second modification of the first embodiment.

Since it is not required to cause a current to flow through the magnetic nanowire 4 of the magnetic memory 1 in order to drive the magnetic domain walls, the end portions of the magnetic nanowire 4 can be connected to each other to form a ring. Specifically, although the magnetic nanowire 4 extending in the X-axis direction has been described as an example, the magnetic nanowire 4 may be in a ring shape in the x-y plane, as shown in FIG. 25 as an example. In this case, the magnetic memory 1 includes the electrodes $7_i$ (i=1, . . . 12) and the insulating layers $6_i$ (i=1, . . . 12) provided on the upper surface (the plane on the positive side on the Z axis) of the magnetic nanowire 4, and the electrodes $9_j$ (j=1, . . . ) and the insulating layers $8_j$ (j=1, . . . ) provided onto the lower surface (the plane on the negative side on the Z axis) of the magnetic nanowire 4, which are not shown in FIG. 25.

In the foregoing descriptions, the voltages to be applied to the electrodes $7_i$ (i=1, . . . ) and the electrodes $9_j$ (j=1, . . . ) to shift the magnetic domain walls are negative voltages with respect to the potential of the magnetic nanowire 4. However, it is also possible to alternately apply positive voltages to both the electrodes. In this case, the magnetic domain walls shift in the direction opposite to the direction in the case where negative voltages are alternately applied.

Figure 26:
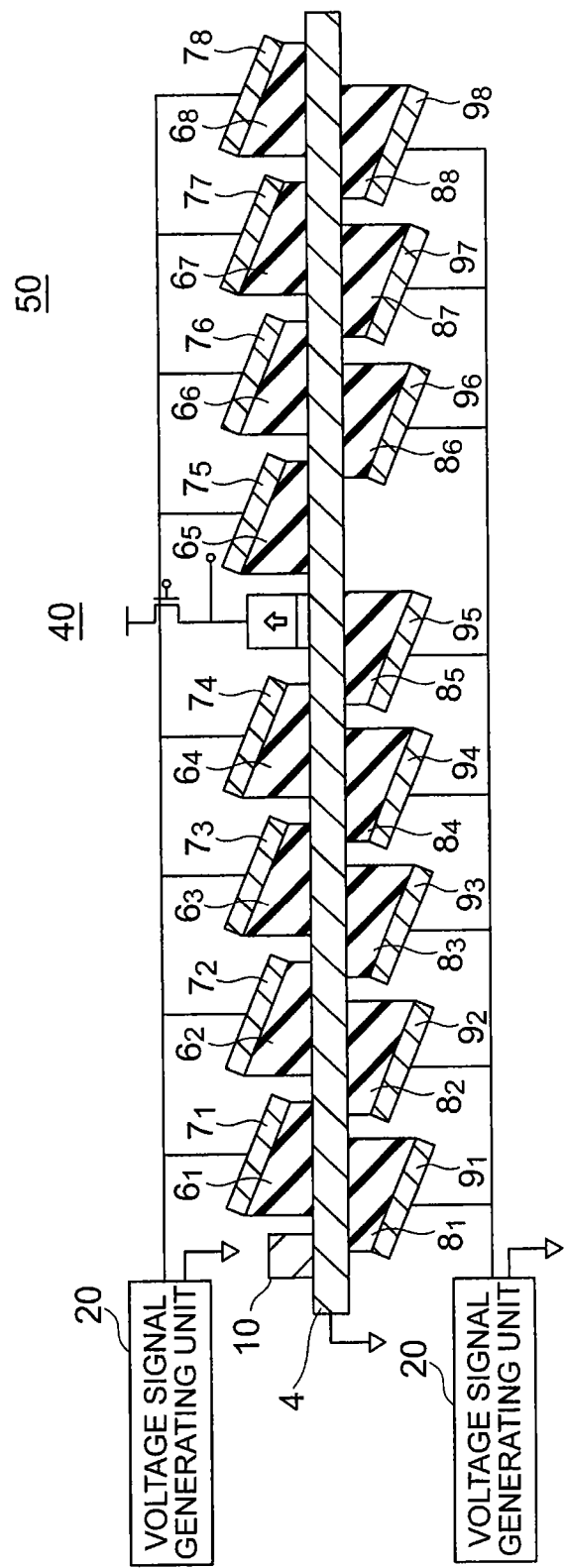
FIG. 26 is a cross-sectional view showing a magnetic memory according to a third modification of the first embodiment.

Furthermore, as shown in FIG. 26, the direction in which the thickness of the insulating layers $6_i$ (i=1, . . . ) changes along the Z axis may be opposite to the direction in which the thickness of the insulating layers $8_j$ (j=1, . . . ) changes along the Z axis. However, in such a case, the signs of the voltages to be applied to the electrodes $7_i$ (i=1, . . . ) and the electrodes $9_j$ (j=1, . . . ) in order to drive the magnetic domain walls should be opposite to each other. For example, if a voltage Vadd1<0 is applied to the electrodes $7_i$ (i=1, . . . ), a voltage Vadd2>0 should be applied to the electrodes $9_j$ (j=1, . . . ) to drive the magnetic domain walls.

As described above, according to the first embodiment, it is possible to provide a magnetic memory capable of reducing power consumption since magnetic domain walls are driven by voltages.

Second Embodiment

A method of manufacturing a magnetic memory according to a second embodiment is going to be described with FIGS. 27 to 35 as references. For the simplification of explanation, the descriptions of the input/output portion are omitted.

Figure 27:
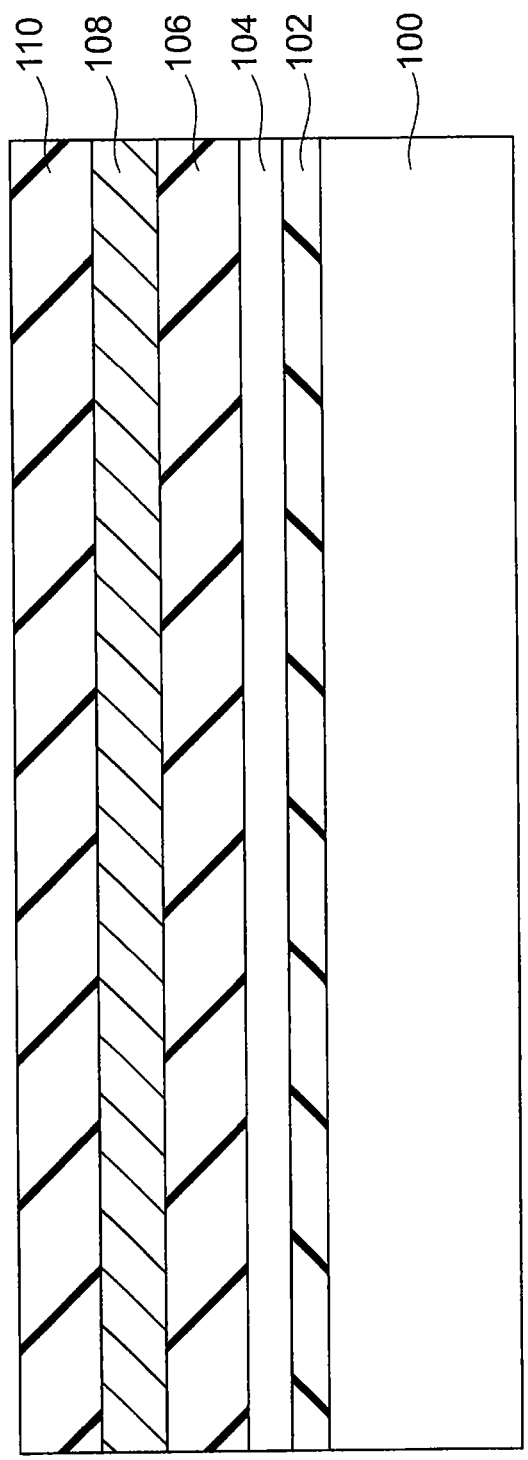
FIG. 27 is a cross-sectional view for explaining a method of manufacturing a magnetic memory according to a second embodiment.

First, a silicon substrate 100, with a thermally oxidized film 102 on its surface, is prepared, and put into an ultra high vacuum sputtering apparatus. Subsequently, an appropriate base layer 104 is formed on the thermally oxidized film 102, and a magnesium oxide (MgO) layer 106, a TbFeCo layer 108, and a MgO layer 110 are sequentially formed on the base layer 104 in this order to form a multi-layer film (FIG. 27).

Figure 28:
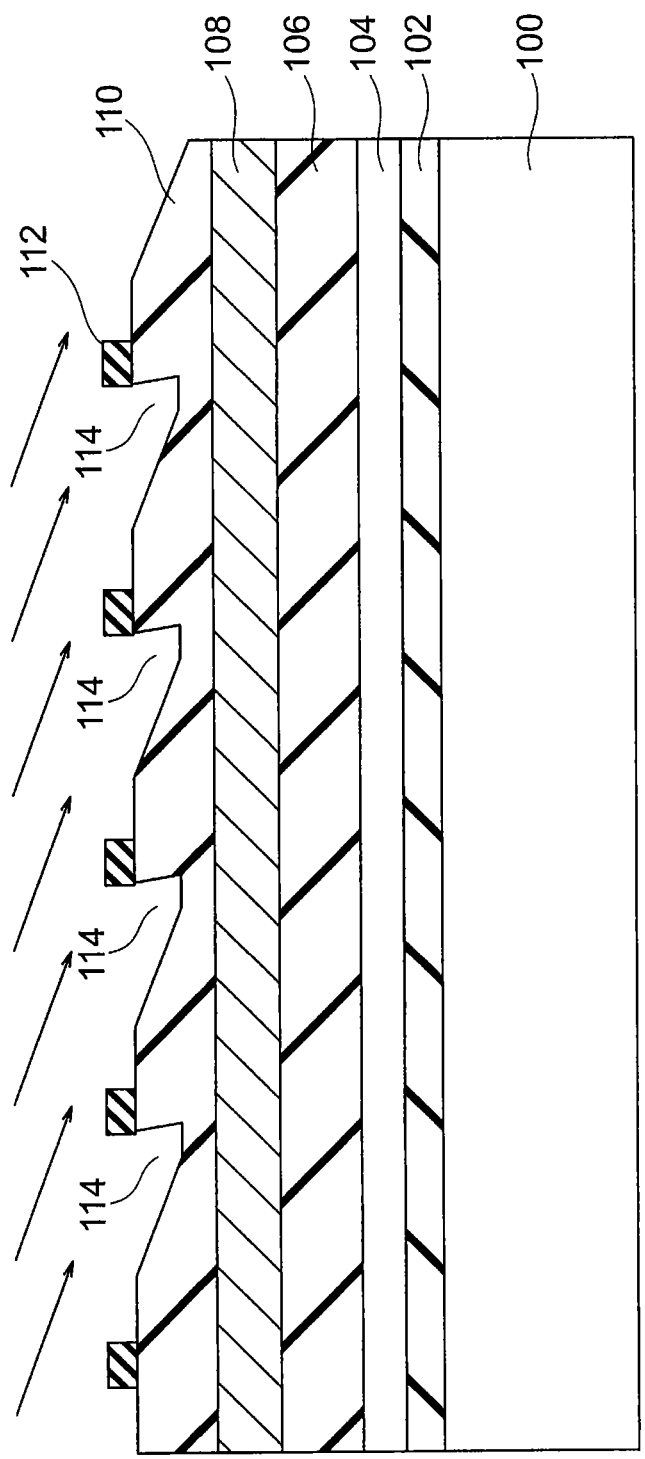
FIG. 28 is a cross-sectional view for explaining the method of manufacturing the magnetic memory according to the second embodiment.

Next, a negative resist is applied onto the MgO layer 110, and nanowire patterns arranged in parallel and at regular intervals are drawn and developed by an electron beam lithography apparatus. As a result, a resist mask 112, in which the nanowire patterns are arranged in parallel, is formed on the MgO layer 110 (FIG. 28). Subsequently, the wafer is put into an argon ion milling apparatus and diagonally irradiated with ion beams as shown in FIG. 28 to trim the MgO layer 110. A milling process, with the nanowire patterns being used as masks, advances, and then trenches 114 each having an inclined cut plane on the surface of the MgO layer 110 (FIG. 28) are formed.

Figure 29:
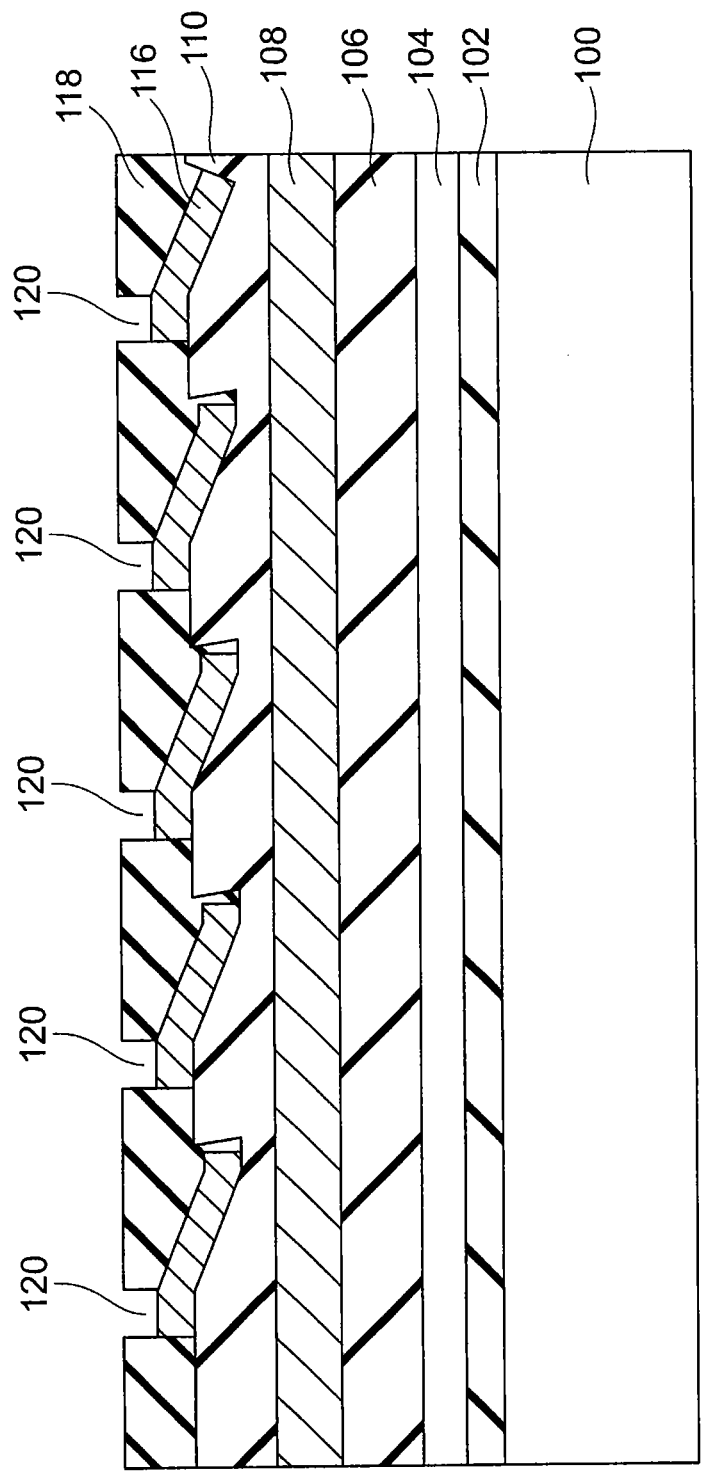
FIG. 29 is a cross-sectional view for explaining the method of manufacturing the magnetic memory according to the second embodiment.

Next, the wafer is put into a ultra high vacuum metal film forming apparatus. Films of Ta and Cu, which are materials for forming electrodes, are sequentially formed onto the MgO layer 110. At this time, the nanowire resist patterns of the resist mask 112 and the projected portions of the trenches 114 serve as masks, and electrodes 116 as shown in FIG. 29 are formed (FIG. 29). Then, the wafer is temporarily taken out, and put into an atomic layer chemical vapor deposition apparatus to deposit $SiO_2$ to serve as an insulating layer 118. The $SiO_2$ layer 118 thus deposited is flattened by chemical mechanical polishing (CMP). Thereafter, a positive resist is applied onto the flattened $SiO_2$-layer 118. A resist pattern, in which portions of the resist, corresponding to those of the electrodes 116, are omitted, is formed by deep ultraviolet lithography (not shown in FIG. 29). Then, the wafer is put into a reactive ion etching apparatus (RIE apparatus) to form trenches 120 in the $SiO_2$ layer 118 being via-holes of which bottoms are the surface of the electrodes 116 (FIG. 29).

Figure 30:
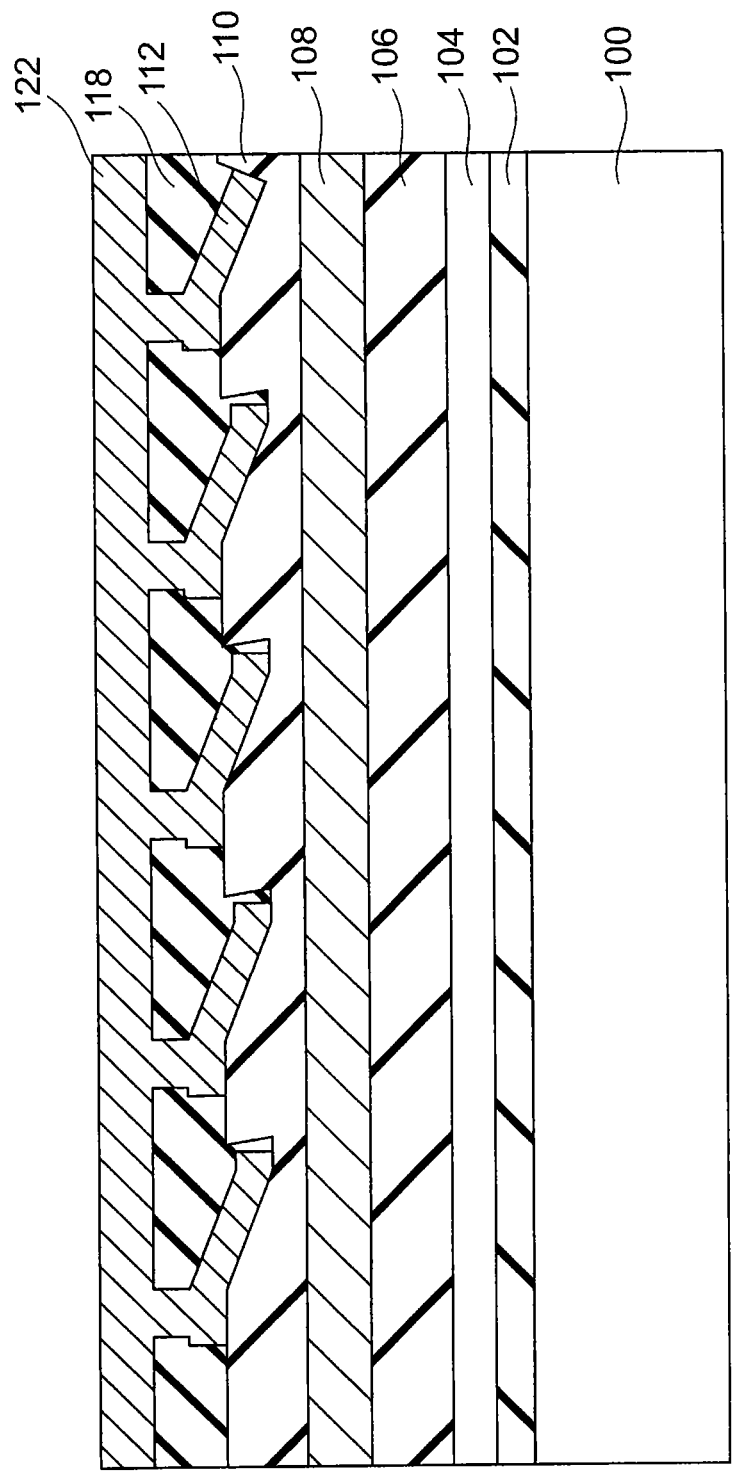
FIG. 30 is a cross-sectional view for explaining the method of manufacturing the magnetic memory according to the second embodiment.

Next, the wafer is put into the metal film forming apparatus again, and then metal layers of Ta and Cu are deposited in this order to fill the trenches 120 after a surface treatment for improving its conductivity. Subsequently, the wafer is taken out and flattened by CMP to form a wiring layer 122 (FIG. 30).

Figure 31:
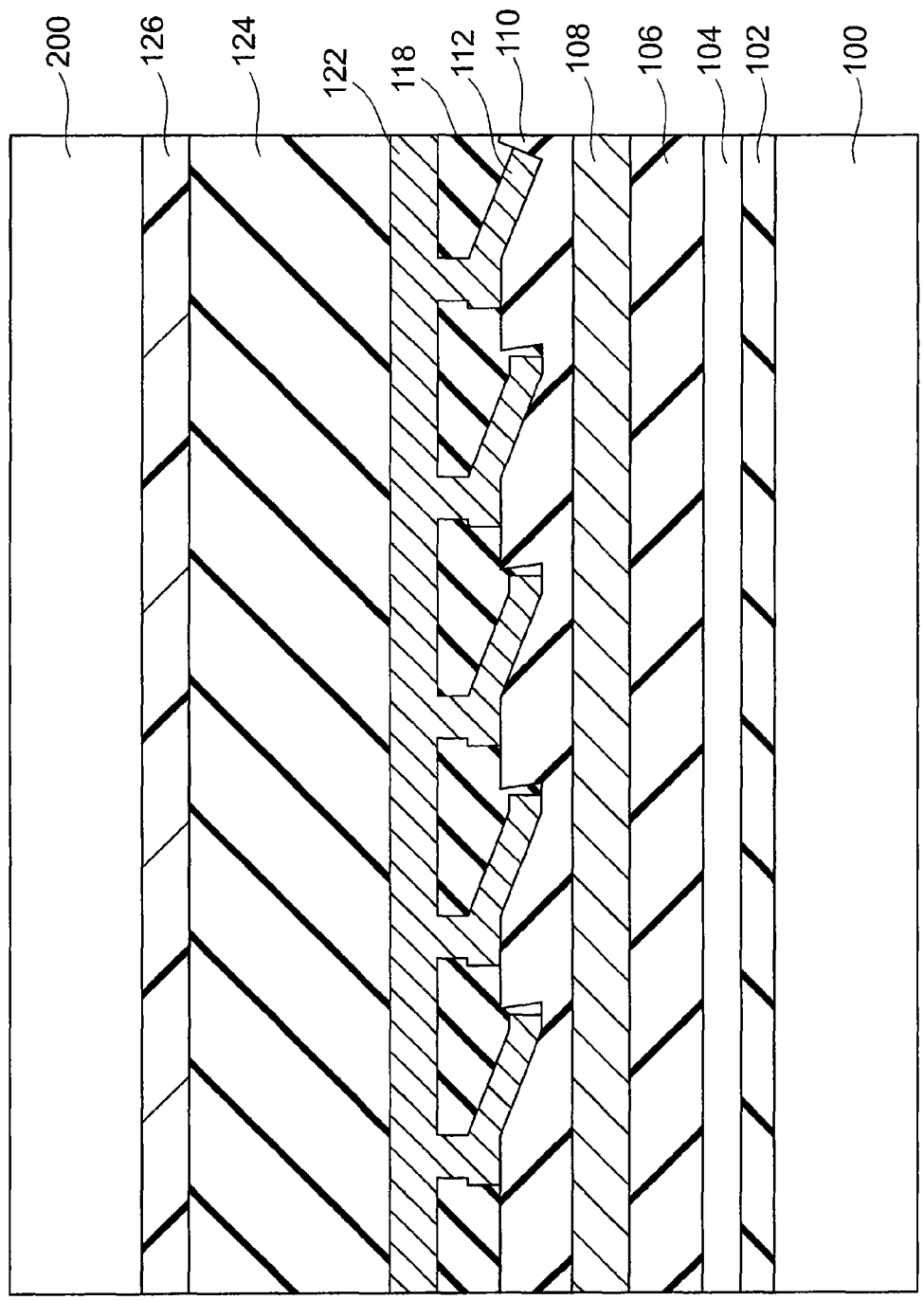
FIG. 31 is a cross-sectional view for explaining the method of manufacturing the magnetic memory according to the second embodiment.
Figure 32:
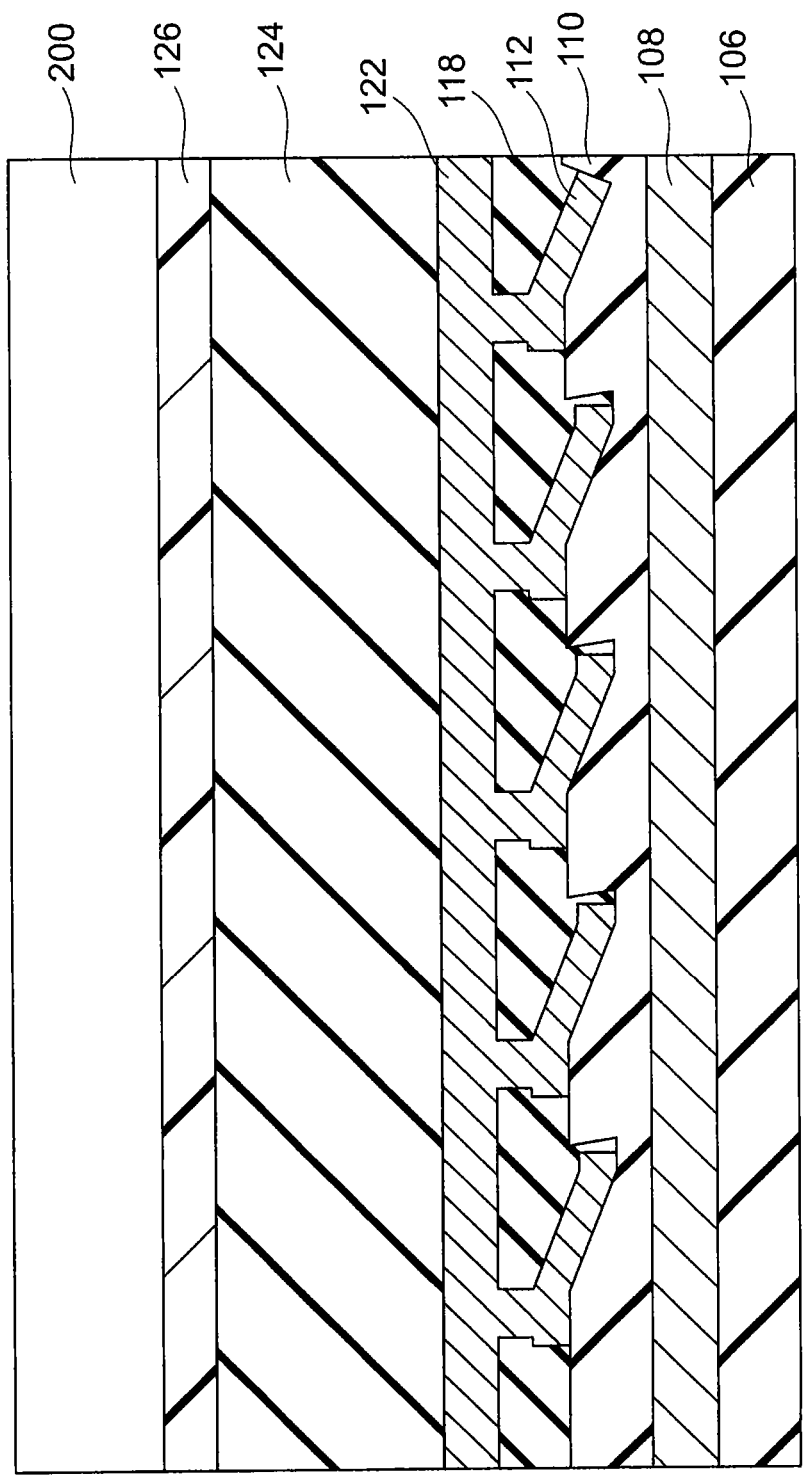
FIG. 32 is a cross-sectional view for explaining the method of manufacturing the magnetic memory according to the second embodiment.

Then, the wafer is put into a chemical vapor deposition apparatus to deposit a $SiO_2$ layer 124 on the wiring layer 122. After a bonding agent 126 is applied onto the $SiO_2$ layer 124, the wafer is fixed onto a surface of another Si wafer 200 by using a wafer bonding apparatus (FIG. 31). Due to the wafer bonding, the wafer is supported from the side of the wiring layer 122 by the Si wafer 200 to which a stacked structure is bonded. Subsequently, the stacked structure is placed upside down, and the wafer 100 is removed by CMP and RIE. Furthermore, the $SiO_2$ layer 102 and the base layer 104 are removed by the ion milling apparatus (FIG. 32).

Figure 33:
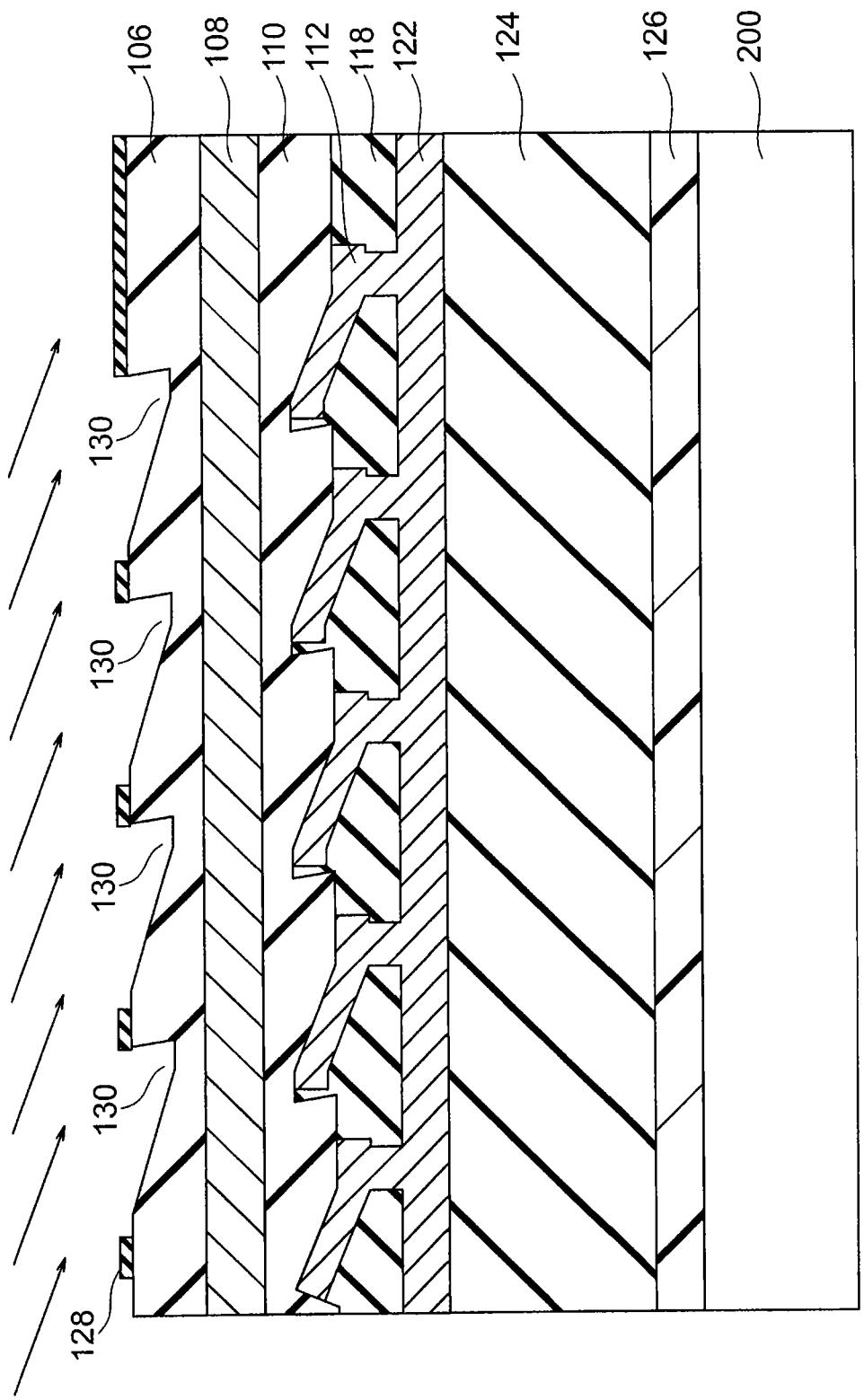
FIG. 33 is a cross-sectional view for explaining the method of manufacturing the magnetic memory according to the second embodiment.

Then, a negative resist is applied onto an upper surface of the MgO layer 106 (the surface opposite to the TbFeCo layer 108), and nanowire patterns are drawn, in parallel and at regular intervals, and developed by using the electron beam lithography apparatus through the processes similar to those described with reference to FIG. 28. As a result, a resist mask 128, in which nanowire patterns are arranged in parallel, are formed on the upper surface of the MgO layer 106 (FIG. 33). Subsequently, the wafer is put into the argon ion milling apparatus and diagonally irradiated with ion beams to trim the MgO layer 106, as shown in FIG. 33. A milling process with the nanowire patterns used as masks advances. As a result trenches 130 each having an inclined cut plane are formed on the surface of the MgO layer 106 (FIG. 33).

Figure 34:
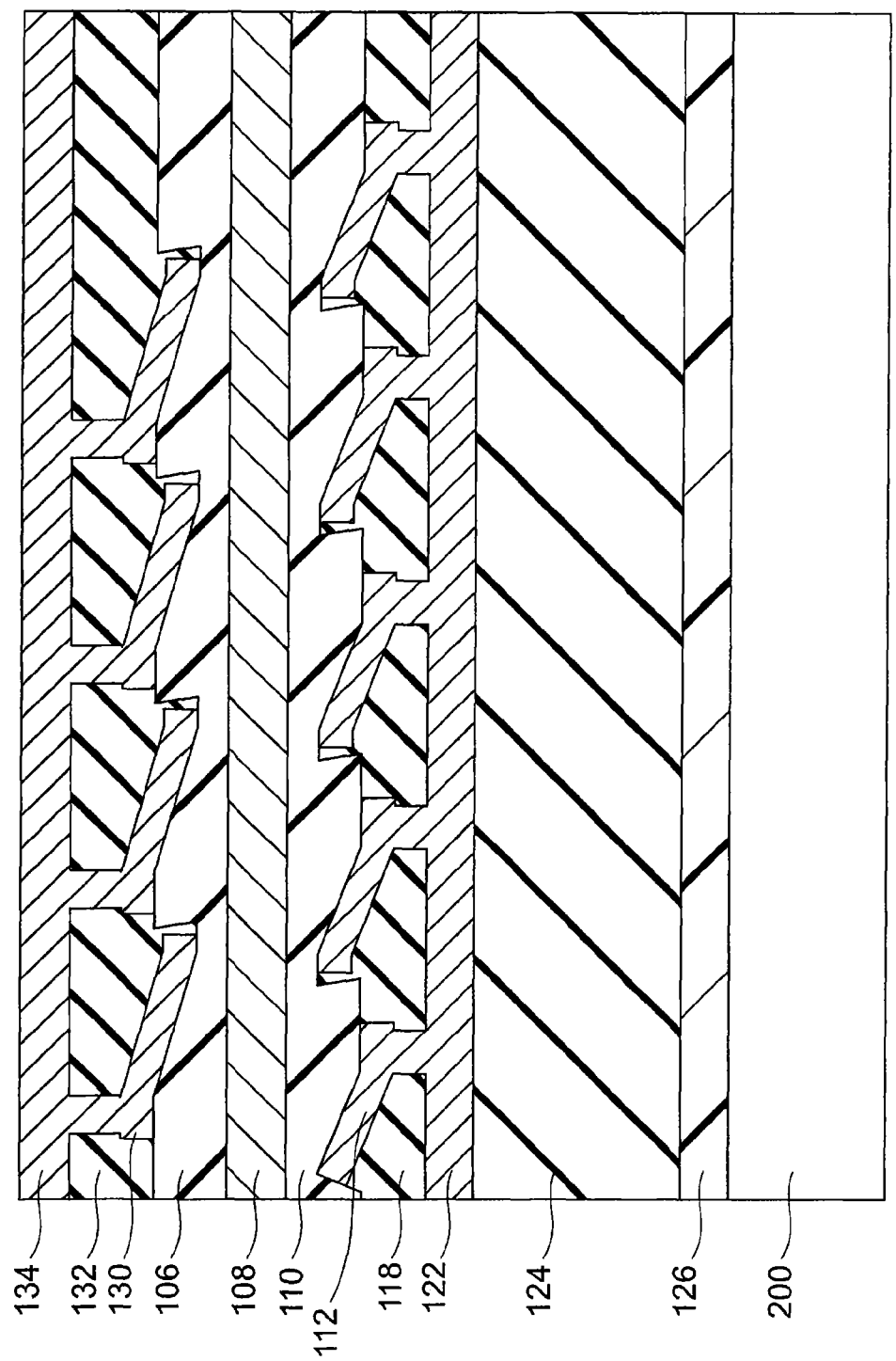
FIG. 34 is a cross-sectional view for explaining the method of manufacturing the magnetic memory according to the second embodiment.

Thus, electrodes 130 as shown in FIG. 34 are formed on the MgO layer 106 by the processes similar to those described with FIG. 29 (FIG. 34). Then, $SiO_2$ to serve as an insulating layer 132 is deposited so that it covers the electrodes 130. The $SiO_2$ layer 132 thus deposited is flattened by chemical mechanical polishing (CMP). Subsequently, a positive resist is deposited onto the flattened $SiO_2$ layer 132, and a resist pattern (not shown), in which portions of resist corresponding to those of the electrodes 130 are omitted, is formed by deep ultraviolet lithography. Thereafter, the wafer is put into a reactive ion etching apparatus (RIE apparatus) to form trenches (not shown) in the $SiO_2$ layer 132 being via-holes of which bottoms are the surfaces of the electrodes 116. Then, the wafer is put into the metal film forming apparatus again, and then metal layers of Ta and Cu are deposited in this order to fill the trenches, after a surface treatment for improving the conductivity. Subsequently, the wafer is taken out and flattened by CMP to form a wiring layer 134 (FIG. 34).

Figure 35:
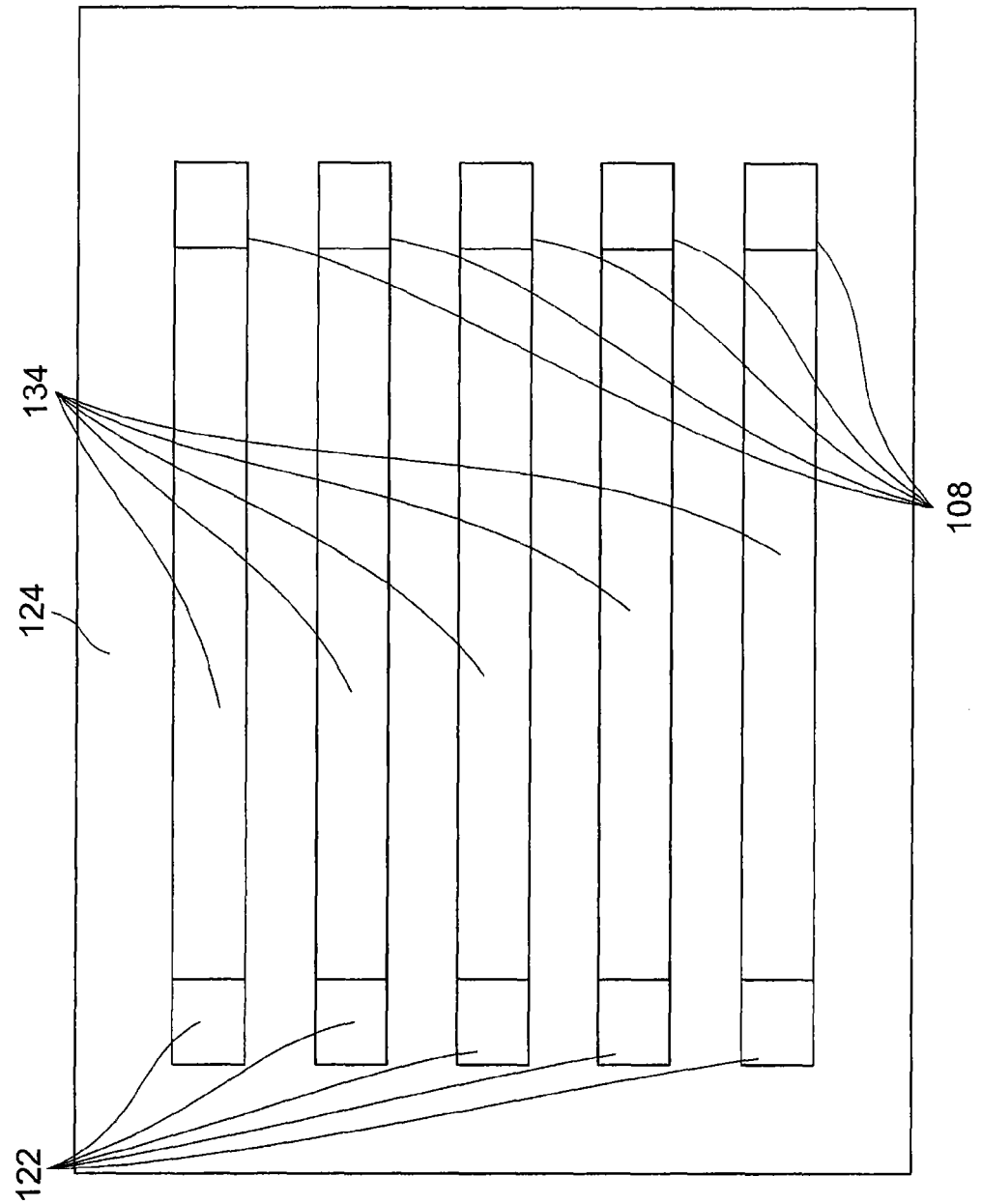
FIG. 35 is a top view for explaining the method of manufacturing the magnetic memory according to the second embodiment.

Next, the stacked structure is processed to become a nanowire extending in the lateral direction as shown in the drawings. A negative resist is applied onto the surface of the wiring layer 134 to form nanowire resist patterns by using the electron beam lithography apparatus and a development apparatus. The wafer is then put into the argon ion milling apparatus with the resist patterns being maintained, and a milling process is performed thereon from the side of the wiring layer 134 until the surface of the $SiO_2$ layer 124 that is in contact with the bonding layer 126 is exposed. Thereafter, a magnetic memory device with the wiring 122, the wiring 134, and the magnetic nanowire 108 being exposed on its surface as shown in FIG. 35 is obtained by performing several times of electron beam lithography, development, and argon milling process for different depth.

Figure 36:
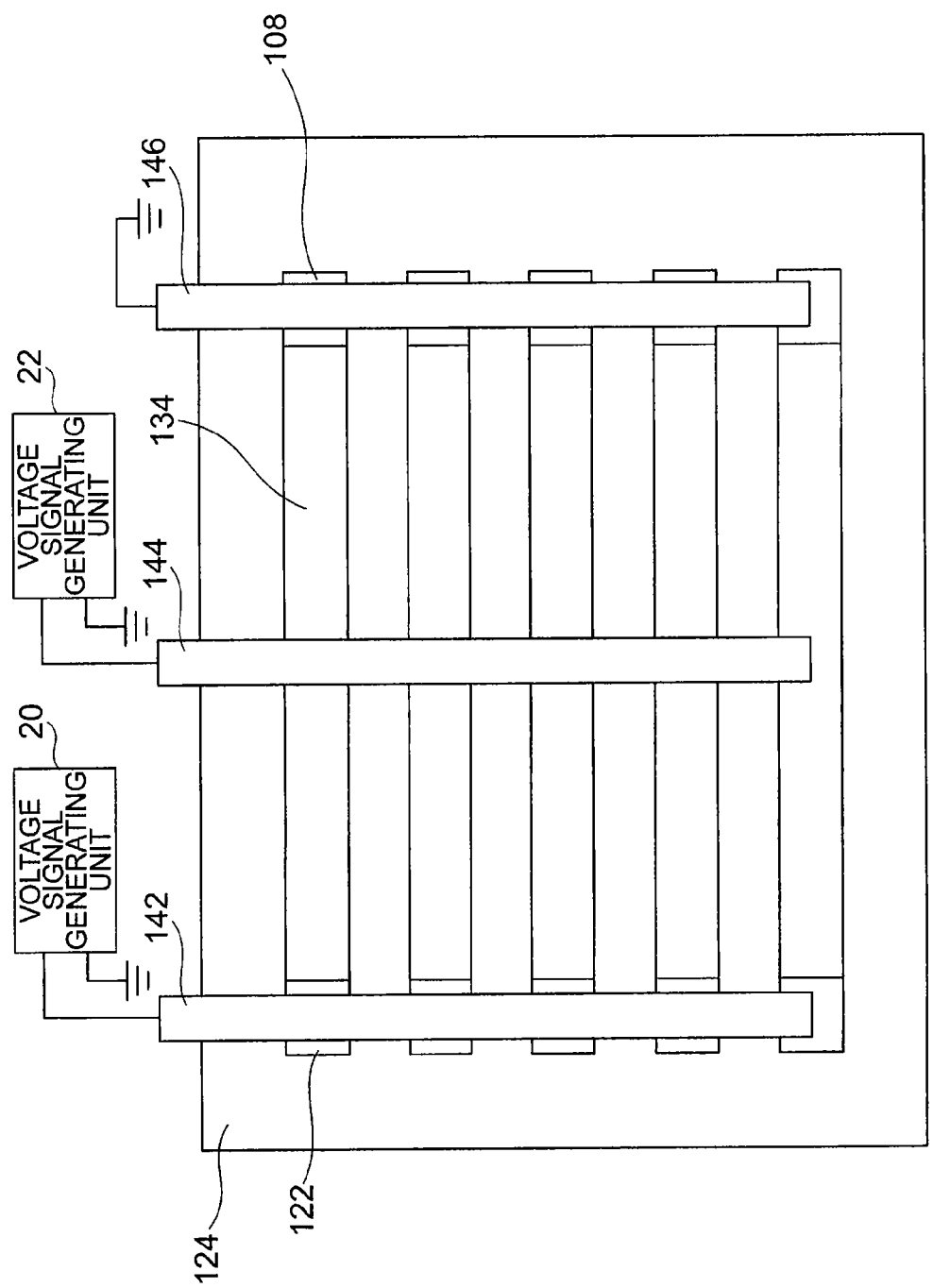
FIG. 36 is a top view for explaining the method of manufacturing the magnetic memory according to the second embodiment.

Finally, a metal film deposition, an electron beam lithography, a development, and a milling process are performed to form wiring 142, wiring 144, and wiring 146, which extend over the wirings 122, the wirings 134, and the magnetic nanowires 108 of a plurality of magnetic memory devices as shown in FIG. 36. The wiring 142 and the wiring 144 are connected to the voltage signal generating unit 20 and the voltage signal generating unit 30, respectively, and the wiring 146 for the magnetic nanowires 108 is connected to a common ground terminal.

As described above, the magnetic memory manufactured by the second embodiment is the same as the magnetic memory according to the first embodiment, and is capable of reducing power consumption as in the case of the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory comprising:
a magnetic nanowire including a first surface and a second surface being opposite to the first surface;
a plurality of first insulating layers provided onto the first surface of the magnetic nanowire along a first direction in which the magnetic nanowire extends, each of the first insulating layers having a first end face that intersects the first direction, and a second end face being opposite to the first end face and arranged to be spaced apart from the first end face along the first direction, a thickness of the first insulating layer over the first end face in a direction perpendicular to the first surface being thicker than a thickness of the first insulating layer over the second end face;
a plurality of first electrodes provided onto surfaces of the first insulating layers opposite to the first surface;
a plurality of second insulating layers provided onto the second surface of the magnetic nanowire along the first direction, each of the second insulating layers having a third end face that intersects the first direction and a fourth end face being opposite to the third end face and arranged to be spaced apart from the third end face along the first direction, a thickness of the second insulating layer over the third end face in the direction perpendicular to the second surface being thicker than a thickness of the second insulating layer over the fourth end face; and
a plurality of second electrodes provided onto surfaces of the second insulating layers opposite to the second surface.

2. The memory according to claim 1, further comprising:
a first voltage signal generator to generate a voltage signal to be applied to the first electrodes; and
a second voltage signal generator to generate a voltage signal to be applied to the second electrodes.

3. The memory according to claim 2, wherein:
when a magnetic domain wall of the magnetic nanowire is shifted in one of the first direction and a second direction that is opposite to the first direction, a polarity of the voltage signal generated by the first voltage signal generator is the same as a polarity of the voltage signal generated by the second voltage signal generator.

4. The memory according to claim 1, wherein there is a space between adjacent two of the first insulating layers.

5. The memory according to claim 1, further comprising a writing unit for writing magnetization information to the magnetic nanowire.

6. The memory according to claim 5, wherein the writing unit includes a wiring, and the magnetization information is written to the magnetic nanowire by causing a current to flow through the wiring.

7. The memory according to claim 5, wherein the writing unit is provided onto one of the first surface and the second surface of the magnetic nanowire, and includes a magnetic layer and a nonmagnetic layer provided between the magnetic layer and the magnetic nanowire.

8. The memory according to claim 1, further comprising a reading unit for reading out magnetization information from the magnetic nanowire.

9. The memory according to claim 1, wherein two end portions of the magnetic nanowire located in a direction along which the magnetic nanowire extends are connected with each other.

10. A magnetic memory comprising:
a magnetic nanowire including a first surface and a second surface being opposite to the first surface;
a plurality of first insulating layers provided onto the first surface of the magnetic nanowire along a first direction in which the magnetic nanowire extends, each of the first insulating layers having a first end face that intersects the first direction, and a second end face being opposite to the first end face and arranged to be spaced apart from the first end face along the first direction, a thickness of the first insulating layer over the first end face in a direction perpendicular to the first surface being thicker than a thickness of the first insulating layer over the second end face;
a plurality of first electrodes provided onto surfaces of the first insulating layers opposite to the first surface;
a plurality of second insulating layers provided onto the second surface of the magnetic nanowire along the first direction, each of the second insulating layers having a third end face that intersects the first direction and a fourth end face being opposite to the third end face and arranged to be spaced apart from the third end face along the first direction, a thickness of the second insulating layer over the third end face in the direction perpendicular to the second surface being thinner than a thickness of the second insulating layer over the fourth end face; and
a plurality of second electrodes provided onto surfaces of the second insulating layers opposite to the second surface.

11. The memory according to claim 10, further comprising:
- a first voltage signal generator to generate a voltage signal to be applied to the first electrodes; and
- a second voltage signal generator to generate a voltage signal to be applied to the second electrodes.

12. The memory according to claim 11, wherein:
when a magnetic domain wall of the magnetic nanowire is shifted in one of the first direction and a second direction that is opposite to the first direction, a polarity of the voltage signal generated by the first voltage signal generator is opposite to a polarity of the voltage signal generated by the second voltage signal generator.

13. The memory according to claim 10, wherein there is a space between adjacent two of the first insulating layers.

14. The memory according to claim 10, further comprising a writing unit for writing magnetization information to the magnetic nanowire.

15. The memory according to claim 14, wherein the writing unit includes a wiring, and the magnetization information is written to the magnetic nanowire by causing a current to flow through the wiring.

16. The memory according to claim 14, wherein the writing unit is provided onto one of the first surface and the second surface of the magnetic nanowire, and includes a magnetic layer and a nonmagnetic layer provided between the magnetic layer and the magnetic nanowire.

17. The memory according to claim 10, further comprising a reading unit for reading out magnetization information from the magnetic nanowire.

18. The memory according to claim 10, wherein two end portions of the magnetic nanowire located in a direction along which the magnetic nanowire extends are connected with each other.

* * * * *